United States Patent
Tagusa

(10) Patent No.: US 8,101,018 B2
(45) Date of Patent: Jan. 24, 2012

(54) METHOD FOR FABRICATING A SEMICONDUCTOR DEVICE AND APPARATUS FOR INSPECTING A SEMICONDUCTOR

(75) Inventor: Yasunobu Tagusa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 1019 days.

(21) Appl. No.: 10/598,488

(22) PCT Filed: Mar. 2, 2005

(86) PCT No.: PCT/JP2005/004036
§ 371 (c)(1),
(2), (4) Date: Aug. 31, 2006

(87) PCT Pub. No.: WO2005/086211
PCT Pub. Date: Sep. 15, 2005

(65) Prior Publication Data
US 2007/0173039 A1    Jul. 26, 2007

(30) Foreign Application Priority Data
Mar. 4, 2004  (JP) ................................ 2004-060511

(51) Int. Cl.
*C30B 1/02* (2006.01)
(52) U.S. Cl. ................... 117/8; 117/88; 117/89; 117/92
(58) Field of Classification Search ............. 117/8, 88, 117/89, 92
See application file for complete search history.

(56) References Cited

FOREIGN PATENT DOCUMENTS

| JP | 6-7101 B2 | 1/1994 |
|---|---|---|
| JP | 2638554 B2 | 4/1997 |
| JP | 2001-110861 A | 4/2001 |
| JP | 2001-196430 A | 7/2001 |
| JP | 2001-257176 A | 9/2001 |
| JP | 3342387 B2 | 8/2002 |
| JP | 2004-063504 A | 2/2004 |
| JP | 2004-071907 A | 3/2004 |
| JP | 2004-179190 A | 6/2004 |
| JP | 2004-207270 A | 7/2004 |

OTHER PUBLICATIONS

International Search Report issued in the corresponding International Application No. PCT/JP2005/004036, mailed on Jun. 21, 2005.

*Primary Examiner* — Bob M Kunemund
(74) *Attorney, Agent, or Firm* — Keating & Bennett, LLP

(57) ABSTRACT

In a method for fabricating a semiconductor device and an apparatus for inspecting a semiconductor, laser processing is performed at different laser powers at different positions on a monitor substrate from a plurality of substrates having undergone an SPC step, to form polycrystalline silicon film over the entire area of the substrate. Thereafter, in an optimum power inspection/extraction step, the polycrystalline silicon film formed with varying film quality on the monitor substrate is inspected on inspection equipment to determine the optimum laser power. Then, in a laser processing step, the surface of the subsequent substrates having undergone the SPC step is irradiated with laser at the optimum laser power. Thus, high-quality polycrystalline silicon film is formed over the entire area of the substrate.

12 Claims, 19 Drawing Sheets

US 8,101,018 B2

METHOD FOR FABRICATING A SEMICONDUCTOR DEVICE AND APPARATUS FOR INSPECTING A SEMICONDUCTOR

BACKGROUND OF THE INVENTION

1. Field of the Invention

The present invention relates to a method for fabricating a semiconductor device incorporating a circuit built with thin-film transistors (hereinafter TFTs), and also relates to an apparatus for inspecting a semiconductor.

2. Description of the Related Art

TFTs using polycrystalline silicon film are being eagerly researched and developed for higher performance by different manufacturers with intense competition among them. In progress are various kinds of uses of such TFTs with a view to achieving, for example, sheet computers and the like in the future. One way of obtaining higher performance with liquid crystal display devices is to increase the mobility of carriers in TFTs. For this purpose, polycrystalline silicon film is superseding amorphous silicon film for application in TFTs. Since, in TFTs using polycrystalline silicon film, the performance and quality of the polycrystalline silicon film is the key to enhanced TFT characteristics, it is becoming increasingly necessary to develop a reliable fabrication method that ensures higher performance and quality in polycrystalline silicon films.

TFTs using polycrystalline silicon film are fabricated, for example, by first forming an amorphous silicon film on a glass substrate by a chemical vapor growth method and then modifying the amorphous silicon film into polycrystalline silicon film. One way of achieving crystallization is by laser processing, whereby the amorphous silicon film on the glass substrate is irradiated with an excimer laser so as to be modified into polycrystalline silicon film. Crystallization by laser processing can be performed at a lower temperature than the strain point of the glass substrate, and thus offers the advantage of omitting the use of an expensive heat-resistant quartz substrate. This is inviting intense competition in the development of crystallization by laser processing among a number of academic institutions and industrial enterprises. Moreover, for further enhanced TFT characteristics, techniques for obtaining larger grain size in crystallization by laser processing are being developed.

One conventionally developed technique for obtaining larger grain size in crystallization by laser processing is a method called the CGS (continuous grain silicon) method, whereby polycrystalline silicon film is formed by the use of a catalyst. The applicant of the present invention is the pioneer in developing this method. According to this method, a metal element that promotes crystallization (for example, nickel) is added to amorphous silicon film, which is then heated so that crystalline silicon starts forming from regions where the metal element has been added (the SPC step), followed by laser processing whereby crystallization is spread over substantially the entire area of the amorphous silicon film. By this method, it is possible to produce high-performance polycrystalline silicon with a carrier mobility of about 100 $cm^2$/Vs or more.

Among other conventionally developed techniques for obtaining a larger grain size is one involving laser processing performed in a plurality of steps.

Crystallization by laser processing, however, has the following disadvantages. As crystallization progresses, grain boundaries with a grain size of, for example, about 1 μm or more form in the polycrystalline silicon film. As the grain size increases, projections grow in the polycrystalline silicon film along the grain boundaries in such a way as to push up the enlarged crystal grains, increasing the surface irregularities (surface roughness) of the polycrystalline silicon film.

Moreover, if laser processing is performed at a laser power far lower than the optimum laser power, the amorphous silicon does not completely crystallize. At a higher laser power, crystallization progresses, but a laser power even slightly higher than the optimum laser power value promotes recrystallization of the amorphous silicon film, resulting in poor characteristics in the polycrystalline silicon film.

Moreover, the laser power of laser processing equipment varies with time from the initially set level, and accordingly the quality of the amorphous silicon film on the glass substrate varies with time. This hampers stable formation of the polycrystalline silicon film.

As discussed above, polycrystalline silicon film produced by laser processing is sensitive to the laser power at which it is processed. This makes it essential to set a proper laser power.

For this reason, there have conventionally been disclosed and proposed monitoring methods according to which a fabrication process additionally includes a step of determining the optimum laser power value so that a laser processing step is performed with the thus determined optimum laser power value (for example, see Japanese Patent Application Laid-Open No. 2001-257176).

With a method for fabricating a semiconductor device that additionally includes a step as described above, it may be possible to set the optimum laser power value to a certain extent.

However, no monitoring methods have been conventionally described that permit setting the optimum laser power for substrates that have undergone preprocessing involving one or more steps for modifying amorphous silicon film. Thus, there is a possibility that the fabrication process that is used to produce monitor substrates (e.g., test substrates) in the course of which the optimum laser power is determined differs from the fabrication process that is used to produce product substrates in the course of which laser processing is performed at the thus determined laser power. For example, as shown in the process flow chart in FIG. 1, there is a possibility that, for a monitor substrate with amorphous silicon film that has not undergone an SPC step 2 in which it would be heated with a catalyst added thereto, the laser power is determined in an optimum power inspection/extraction step 4.

Moreover, no detailed description has conventionally been given of how to evaluate the results obtained in the optimum power inspection/extraction step 4 to determine the optimum laser power, nor how to make evaluations on an absolute basis for automatic approval and rejection.

As discussed above, in practice, a laser processing step is not always performed at the optimized laser power, resulting in amorphous silicon film being produced with poor performance and quality. This makes it necessary to set a more optimal laser power in producing polycrystalline silicon film.

SUMMARY OF THE INVENTION

In view of the conventionally encountered problems discussed above, preferred embodiments of the present invention provide a method for fabricating a semiconductor device and an apparatus for inspecting a semiconductor that permit polycrystalline silicon film to be produced with enhanced performance and quality as a result of further optimizing the laser power at which a laser processing step is performed for modifying amorphous silicon film into polycrystalline silicon film.

According to a preferred embodiment of the present invention, a method for fabricating a semiconductor device includes a film formation step for forming amorphous silicon film on a substrate; a preprocessing step, performed in one or more steps, for modifying the amorphous silicon film to prepare it for being made polycrystalline; and a laser processing step for producing polycrystalline silicon film by performing laser processing on the amorphous silicon film modified through the preprocessing step. The method further includes a laser power inspection/extraction step for determining a laser power based on a predetermined inspection performed on a predetermined region of the amorphous silicon film having undergone the preprocessing step. Moreover, the laser processing step uses the laser power determined in the laser power inspection/extraction step. With this method, it is possible to produce polycrystalline silicon film at a more optimal laser power, and thereby enhance and stabilize the quality of mass-produced products. The optimum laser power varies with the thickness and quality of the amorphous silicon film before being subjected to laser processing, but, with the preferred embodiments of this invention, it is possible to produce polycrystalline silicon film with the optimum laser power determined for each individual product substrate. This, as compared with methods using monitor substrates, reduces extra materials and fabrication steps, and thus helps increase production efficiency.

In the above-described method for fabricating a semiconductor device, the laser power inspection/extraction step may determine the laser power through inspection using spectroscopy. This makes it possible to determine the optimum laser power with higher accuracy and stability. It is also possible to compactly extend an optical fiber from the main unit of the spectroscopic equipment to the measurement spot.

In the above-described method for fabricating a semiconductor device, the spectroscopy may be performed at a measurement wavelength of about 700 nm to about 800 nm. The spectroscopic characteristics in this wavelength range are observed uniquely in high-quality polycrystalline silicon film, and thus permit checking whether or not high-quality polycrystalline silicon film is being produced. Moreover, the measurement can be performed in or near the laser processing room without being affected by the excimer laser processing light having a wavelength of 308 nm.

In the above-described method for fabricating a semiconductor device, the laser power inspection/extraction step may determine the laser power through inspection using imaging whereby light shines on a measurement spot to detect an image acquired by targeting at the measurement spot. With the present preferred embodiment, it is possible to determine the optimum laser power with higher accuracy and stability. Moreover, it is also possible to detect, from the acquired image, abnormal unevenness on the film surface.

The above-mentioned inspection using imaging may inspect for the presence of a foreign object or an abnormality in film quality. With the present preferred embodiment, it is possible to readily inspect whether or not there is any abnormality in the polycrystalline silicon film.

In the above-described method for fabricating a semiconductor device, the above-mentioned inspection using spectroscopy or imaging may be performed with measurement light shining on a measurement spot from around the measurement spot. With this method, irrespective of whether the crystal structure of the polycrystalline silicon film is randomly or regularly directional, it is possible to measure the values of the spectroscopic characteristics and brightness in a constant measurement environment.

In the above-described method for fabricating a semiconductor device, the laser power inspection/extraction step may perform inspection near laser processing equipment that performs the laser processing in the laser processing step. This makes it possible to quickly feed the determined laser power back to the laser processing equipment. In particular, in a case where the laser power is determined by the use of a product substrate, it is possible to immediately perform laser processing. Thus, it is possible to produce polycrystalline silicon film without giving consideration to the time-related instability of the light source of the laser processing equipment.

In the above-described method for fabricating a semiconductor device, the laser power inspection/extraction step may inspect the film surface on the substrate. By inspecting the streaked pattern on the polycrystalline silicon film after the laser processing step, it is possible to determine whether or not the laser power at which the laser processing is performed is too low or too high relative to the optimum laser power. Thus, it is possible to vary the laser power appropriately with time.

In the above-described method for fabricating a semiconductor device, the laser power inspection/extraction step may perform inspection by using equipment provided with both an inspection function for inspecting the polycrystalline silicon film and an inspection function for determining the laser power. This helps reduce the footprint of the equipment and reduce the investment in fabrication facilities.

In the above-described method for fabricating a semiconductor device, the laser power inspection/extraction step may set a measurement fixed-quantity value against which to evaluate measurement results. This measurement fixed-quantity value can be used to evaluate the distribution, transition, and acceptability of the characteristics of the polycrystalline silicon film and amorphous silicon film.

The measurement fixed-quantity value may be determined by using equipment having a calibration substrate placed thereon and provided with a function for performing calibration. This increases measurement accuracy. In particular, placing a calibration substrate eliminates the need for a mechanism that requires the calibration substrate to be put into and taken out of the calibration equipment, leading to a shorter measurement cycle.

In the above-described method for fabricating a semiconductor device, the laser power inspection/extraction step may perform inspection by using equipment provided with both a function for inspecting the polycrystalline silicon film and a function for automatically determining the optimum laser power value and automatically feeding the automatically determined optimum laser power value to the laser processing equipment. Conventionally, human operators determine the optimum laser power and input this into the laser processing equipment, resulting in susceptibility to human errors. By contrast, with the present preferred embodiment, it is possible to eliminate such human errors. Moreover, it is possible to efficiently set the laser power on the laser processing equipment.

In the above-described method for fabricating a semiconductor device, the laser processing step may use a laser power about 5 mJ or about 10 mJ lower than the optimum laser power value determined in the laser power inspection/extraction step. If laser processing is performed at the optimum laser power value determined in the laser power inspection/extraction step, the laser processing may actually be performed at a laser power higher than the optimum laser power value due to the influence of the within-the-surface distribution of the optimum laser power value. When polycrystalline silicon film is subjected to laser processing at a laser power higher than the optimum laser power value, its performance and quality abruptly deteriorate. With the present preferred embodiment, it is possible to produce, without being influenced by the within-the-surface distribution, stable polycrystalline silicon film for a long period of time.

In the above-described method for fabricating a semiconductor device, the laser power inspection/extraction step may perform multiple-point measurement inspection on the polycrystalline silicon film. With polycrystalline silicon film, there is a distribution of the optimum laser power due to the thickness and quality of the film varying from one substrate to another. There is also a distribution from one piece of laser processing equipment to another due to, for example, variations in the characteristics and adjustment of their optical components such as lenses. Thus, by measuring the distribution of the optimum laser power in substrates, it is possible to anticipate the trend of the optimum laser power under given fabrication conditions and for a given piece of laser processing equipment.

In the above-described method for fabricating a semiconductor device, the laser power inspection/extraction step may inspect, before the laser processing, the film on the substrate to find the ratio of amorphous silicon film to polycrystalline silicon film. This helps stabilize the performance and quality of polycrystalline silicon film and thereby increase the yield.

In the above-described method for fabricating a semiconductor device, the laser power inspection/extraction step may inspect, after the laser processing, the film on the substrate to find the ratio of amorphous silicon film to polycrystalline silicon film. By quickly inspecting the amorphous silicon film that remains uncrystallized after laser processing, it is possible to quickly detect, for example, an abnormality in the laser preprocessing step and an abnormality in performance that results from an abnormality in the optical system. Thus, it is possible to detect abnormalities and take countermeasures against them at an early stage.

In the above-described method for fabricating a semiconductor device, the laser power inspection/extraction step may inspect, before and after the laser processing, the film on the substrate to find the ratio of amorphous silicon film to polycrystalline silicon film. With the present preferred embodiment, by comparing the ratio of amorphous silicon film to polycrystalline silicon film before and after the laser processing, it is possible to make it easier to find the cause for defects, and thus to efficiently reduce losses in mass production.

According to another preferred embodiment of the present invention, an apparatus for inspecting a semiconductor includes a light-emitting portion that emits light, an illuminating member that reflects the light and to direct the light to a predetermined substrate, a magnifying portion that receives the light reflected from the predetermined substrate and magnifies the light, a camera portion that converts the light magnified by the magnifying portion into image data, a processing portion that reads the image data from the camera portion and performs predetermined data processing on the image data, a memory portion that stores an evaluation condition against which the result of the predetermined data processing is evaluated to determine a predetermined value, an evaluating portion that evaluates the result of the predetermined data processing against the evaluation condition to determine the predetermined value, and a transmitting portion that establishes a connection for communication with an external apparatus and transmits the predetermined value to the external apparatus. With the present preferred embodiment, it is possible to eliminate the need for the user to read the optimum value from the measurement results displayed on a display portion and then feed the optimum value to the external apparatus. Thus, it is possible to eliminate human errors in data processing, and to reduce the loss of time as a result of the automation.

In the above-described apparatus for inspecting a semiconductor, the illuminating member may direct the light to the predetermined substrate so that the light strikes the predetermined substrate at an angle of about 30 degrees to about degrees. With the present preferred embodiment, it is possible to reflect the projections on the surface of polycrystalline silicon film due to its crystallinity and thereby perform stable evaluation and measurement.

The above-described apparatus for inspecting a semiconductor may be further provided with a spectroscopic apparatus that shines light of a plurality of different wavelengths in the visible spectrum region to the predetermined substrate, then receives the light reflected from the predetermined substrate to acquire spectroscopic data, and then feeds the spectroscopic data to the processing portion. The processing portion converts the spectroscopic data into light intensity distribution data of the reflected light at the different wavelengths. With the present preferred embodiment, it is possible to share the processing portion, evaluating portion, and the like with the spectroscopic apparatus, and it is also possible to make the apparatus compact and thereby reduce its footprint. Moreover, by the use of the spectroscopic apparatus, the optimum value is automatically fed to the external apparatus, and this helps eliminate human errors in the feeding of the optimum value.

In the above-described apparatus for inspecting a semiconductor, when amorphous silicon film or polycrystalline silicon film is formed on the substrate, the different wavelengths are from about 700 nm to about 800 nm. The spectroscopic characteristics in this wavelength range are observed uniquely in high-quality polycrystalline silicon film, and thus permit checking whether or not high-quality polycrystalline silicon film is being produced. Moreover, the measurement can be performed in or near the laser processing room without being affected by an excimer laser processing light having a wavelength of 308 nm.

In the above-described apparatus for inspecting a semiconductor, when amorphous silicon film or polycrystalline silicon film is formed on the substrate, the evaluating portion determines the optimum laser power value at which to modify the amorphous silicon film into polycrystalline silicon film. With the present preferred embodiment, it is possible to transmit to external laser processing equipment the optimum laser power value at which to modify the amorphous silicon film into polycrystalline silicon film.

With a method for manufacturing a semiconductor device and an apparatus for inspecting a semiconductor according to the preferred embodiments of the present invention, it is possible to stably perform optimized laser processing in a laser processing step. Thus, it is possible to stably produce high-quality polycrystalline silicon film.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Figure 2:
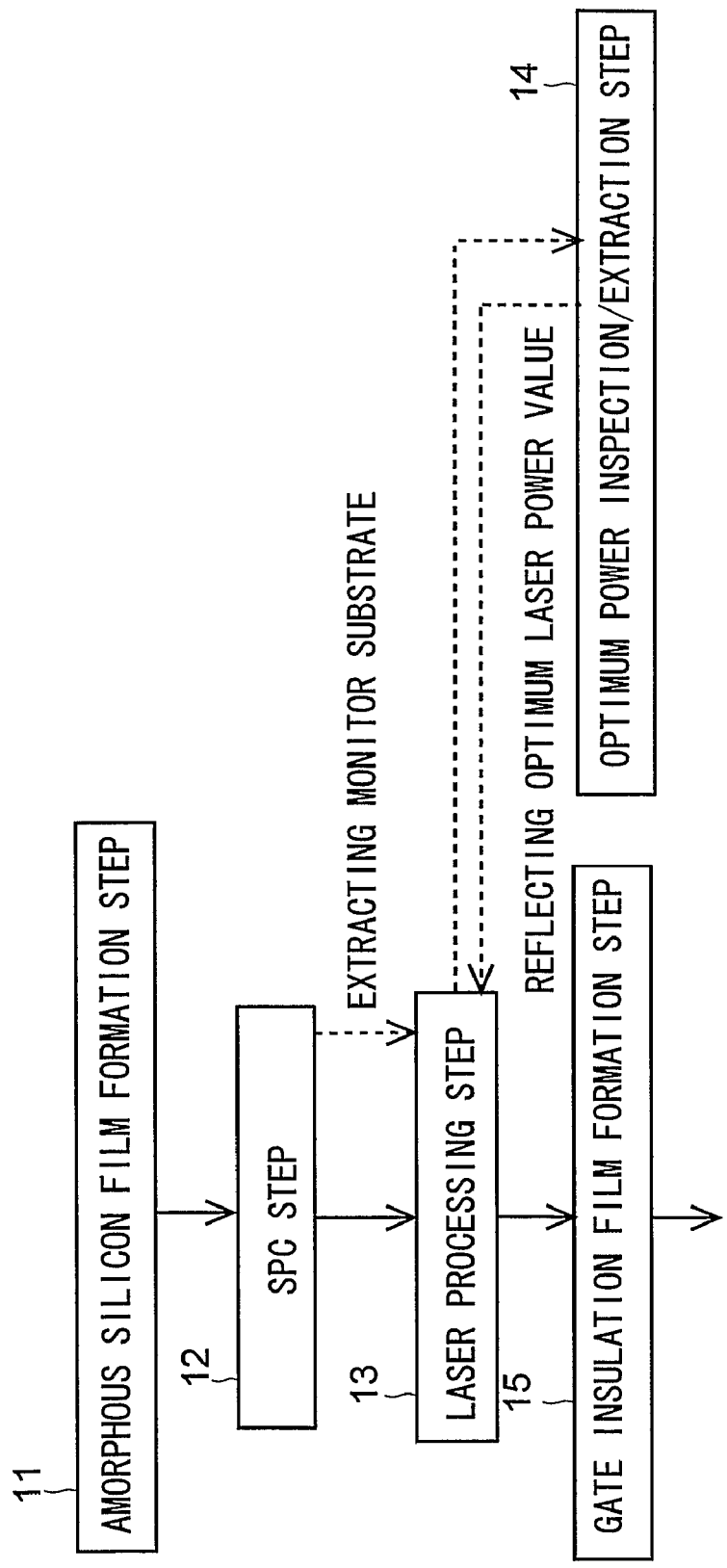
FIG. 2 is a process flow chart showing the process flow according to a preferred embodiment of the present invention.

Hereinafter, a description will be given of examples of methods according to preferred embodiments of the present invention for producing polycrystalline silicon film by using a catalyst. FIG. 2 is a flow chart showing an example of a production method according to a preferred embodiment the invention. As shown in FIG. 2, in this preferred embodiment, the method for producing polycrystalline silicon film by using a catalyst (the CGS, short for continuous grain silicon, method) includes an amorphous silicon film formation step 11 for forming amorphous silicon film on a glass substrate by chemical vapor growth; an SPC step 12 for adding a crystallization-promoting metal element (for example, nickel) to the amorphous silicon film and then heating it so as to form crystalline silicon that starts and extends from regions to which the metal element has been added; a laser processing step 13 for irradiating the amorphous silicon film having undergone the SPC step with a laser so as to form polycrystalline silicon film over the entire area of the substrate; an optimum power inspection/extraction step 14 for determining, by using a monitor substrate having undergone the SPC step 12 and then the laser processing step 13, the optimum value of the laser power at which to perform laser processing; and a gate insulation film formation step 15 for forming a gate insulation film after the laser processing step.

The optimum power inspection/extraction step 14 is a step in which a monitor substrate is extracted from a plurality of substrates having undergone the SPC step 12, and is then, in the laser processing step 13, irradiated with a laser at a laser power varied, for example, in 10 steps in about 5 mJ or about 10 mJ increments. Simultaneously, the spot irradiated with a laser irradiation width of, for example, less than 10 mm is moved in 10 mm increments, and the laser power at each of those laser-irradiated spots on the surface of the monitor substrate is measured on a measurement apparatus to determine, as the optimum laser power value for the laser processing step 13, the laser power at which the intensity peak height (for example, the brightness in a case where imaging is used, as will be described later) is at its maximum.

Next, a description will be given of an example of a method for producing polycrystalline silicon film by using a catalyst (the CGS method) according to the above-described flow process shown in FIG. 2. In the amorphous silicon film formation step 11, an amorphous silicon film having a thickness of, for example, 50 nm is formed on a glass substrate by chemical vapor growth. Then, in the SPC step 12, a substance that promotes crystallization, for example nickel, is added to the amorphous silicon film on the glass substrate, which is then heated so that crystalline silicon starts forming from regions to which the nickel has been added. Next, in the laser processing step 13, a monitor substrate extracted from substrates having undergone the SPC step 12 is subjected to laser processing at a laser power varied, for example, in 10 steps in about 5 mJ or about 10 mJ increments while the spot irradiated with a laser irradiation width of, for example, less than 10 mm is moved in 10 mm increments so that polycrystalline silicon film forms over the entire area of the substrate. Then, in the optimum power inspection/extraction step 14, the polycrystalline silicon film provided with varying film quality on the monitor substrate is measured on an inspection apparatus to determine the optimum laser power value. The thus determined optimum laser power value is then fed back to the laser processing step 13 so that, in the laser processing step 13, the surface of the substrate that has previously undergone the SPC step 12 is irradiated with a laser at the optimum laser power so that polycrystallization progresses over the entire area of the substrate, yielding high-quality polycrystalline silicon film.

In practice, the laser power varies with time, and accordingly the film quality of the amorphous silicon film formed on the substrate varies with time. Thus, it is preferable that the optimum power inspection/extraction step 14 be performed every single lot, or every several lots, to control production while precisely controlling the laser power.

If the laser processing is performed at a laser power even slightly higher than the optimum laser power value, re-crystallization of the amorphous silicon film progresses, making it microcrystalline, and thus abruptly degrading the quality of the polycrystalline silicon film. Moreover, since the optimum laser power has a distribution (with a difference of about 5 mJ to about 10 mJ) within the surface of the substrate, with consideration given to the influence of this within-the-surface distribution, performing the laser processing step at a laser power about 5 mJ or 10 mJ lower than the optimum value makes it possible to produce a stable film for a long period of time.

In the example of the present preferred embodiment, polycrystalline silicon film is formed by the CGS method involving an SPC step. Alternatively, it is also possible to utilize any other method, for example one that performs, instead of the SPC step, the laser processing step twice. Even when such other methods are used, in the same manner as described above, the optimum laser power can be determined by using a monitor or product substrate before the final laser processing step.

The steps performed up to the completion of the production of TFTs are as follows. On the polycrystalline silicon film produced in the laser processing step 13 described above, a gate insulation film having a thickness of, for example, 100 nm is formed on the polycrystalline silicon film in the gate insulation film formation step 15. Then, in the next unillustrated step, a metal film that will serve as a gate electrode is formed, and then the metal film and the gate insulation film are patterned so as to expose portions of the polycrystalline silicon film that will serve as source and drain regions. Next, the exposed portions of the polycrystalline silicon film are doped with a dopant to form source and drain regions. In this way, TFTs are produced.

In the above description, the optimum laser power is determined by the use of a monitor substrate. It is, however, also possible to determine the optimum laser power by the use of a portion of a product substrate having undergone the SPC step 12 where the polycrystalline silicon film is not used as a product. This makes it possible to determine the optimum laser power in a state closer to the actual state of a product substrate without being influenced by the optimum laser power that varies with the thickness and quality of the amorphous silicon film before laser processing. Moreover, as compared with processing a monitor substrate, it is possible to reduce extra materials and steps and thereby improve production efficiency.

Figure 3:
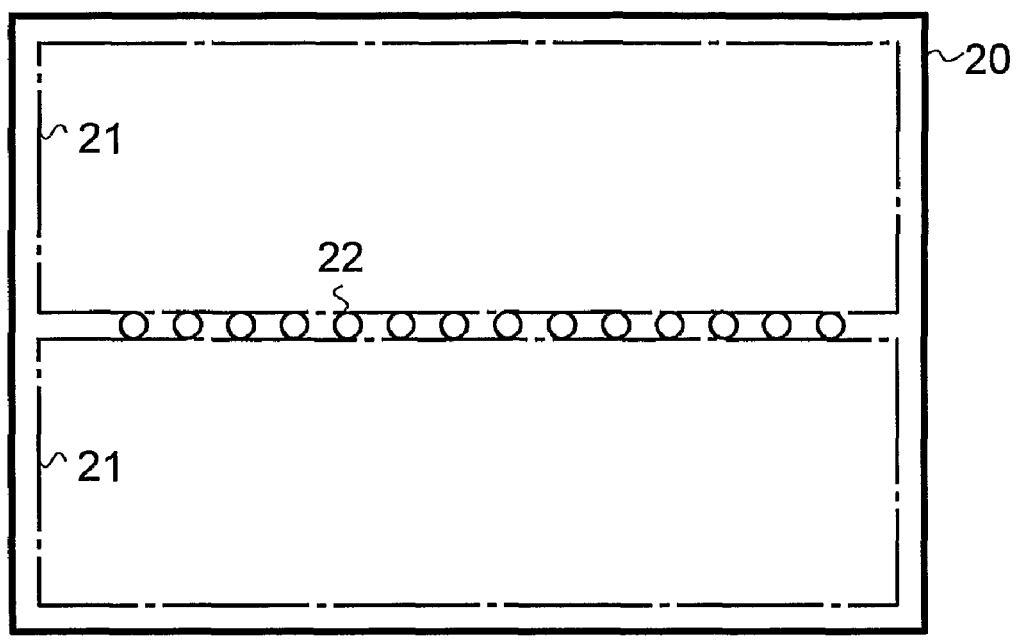
FIG. 3 is a diagram showing the spots where laser processing is performed on a product substrate for inspection.

FIG. 3 is a diagram showing an example of the spots where laser processing is performed for inspection on a product substrate having undergone the SPC step instead of on a monitor substrate. On a product substrate 20 having undergone the SPC step, laser power monitor portions 22 are placed at a portion on the product substrate 20 excluding the functional device portion 21 that will eventually function as a product. In this example, in the middle (or along an edge) of the amorphous silicon film where it has a stable thickness. Then, the laser power monitor portions 22 are irradiated with the desired laser power.

Figure 4:
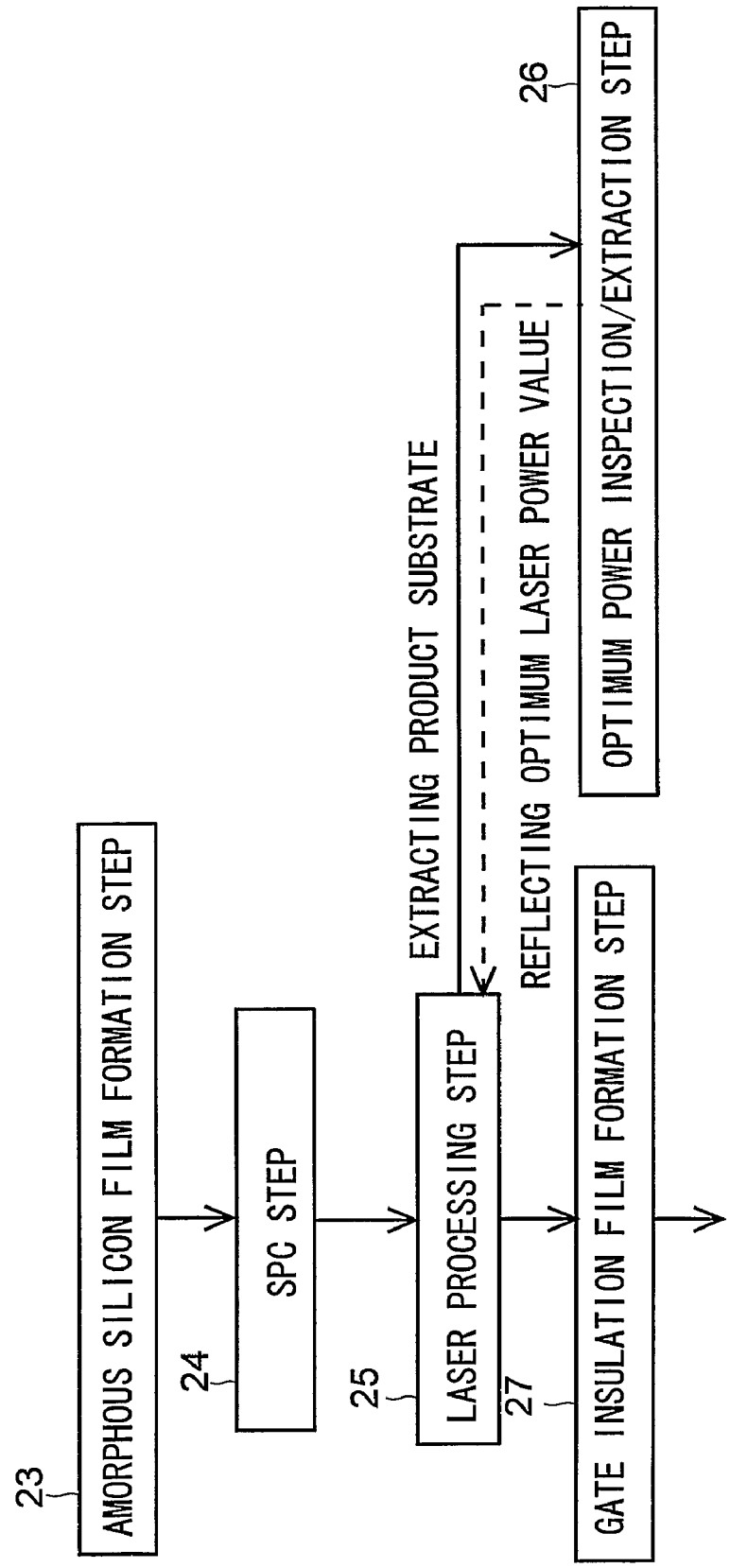
FIG. 4 is a flow chart for use in a case where the process flow according to a preferred embodiment of the present invention is applied to product substrates.

FIG. 4 is an example of a process flow showing how polycrystalline silicon film is formed based on the optimum laser power determined by the use of the product substrate 20 shown in FIG. 3. As shown in FIG. 4, in this preferred embodiment, the method for producing amorphous silicon film by using a catalyst (the CGS method) includes an amorphous silicon film formation step 23 for forming amorphous silicon film on a glass substrate by chemical vapor growth; an SPC step 24 for adding a crystallization-promoting metal element (for example nickel) to the amorphous silicon film and then heating it so that crystalline silicon starts forming from regions to which the metal element has been added; a laser processing step 25 for irradiating the amorphous silicon film having undergone the SPC step 24 with a laser so that polycrystalline silicon film forms over the entire area of the substrate; an optimum power inspection/extraction step 26 for determining, by using a product substrate 20 having undergone the SPC step 24 and then the laser processing step 25, the optimum value of the laser power at which to perform laser processing; and a gate insulation film formation step 27 for forming a gate insulation film after the laser processing step.

The optimum power inspection/extraction step 26 is a step in which the polycrystalline silicon film formed with varying quality in the laser power monitor portions 22 is measured on an inspection apparatus to determine, as the optimum laser power value for the laser processing step 25, the laser power at which the intensity peak height is at its maximum. Beforehand, the product substrate 20 is, in the laser processing step 25, extracted from those having undergone the SPC step 24 and then, in the laser processing step 25, subjected to laser processing whereby the laser power monitor portions 22 on the product substrate 20 are individually irradiated with a laser at a laser power varied, for example, in 10 steps in about 5 mJ or about 10 mJ increments so as to form polycrystalline silicon film in the laser power monitor portions 22.

Next, a description will be given of an example of a method for producing polycrystalline silicon film by using a catalyst (the CGS method) according to the above-described flow process shown in FIG. 4. In the amorphous silicon film formation step 23, an amorphous silicon film having a thickness of, for example, 50 nm is formed on a glass substrate by chemical vapor growth. Then, in the SPC step 24, a substance that promotes crystallization, for example nickel, is added to the amorphous silicon film on the glass substrate, which is then heated so that crystalline silicon starts forming from regions to which the nickel has been added. Next, in the laser processing step 25, laser processing is performed whereby the laser power monitor portions 22 on a product substrate 20 are individually irradiated with a laser at a laser power varied, for example, in about 10 steps in about 5 mJ or about 10 mJ increments so as to form polycrystalline silicon film in the laser power monitor portions 22. Then, in the optimum power inspection/extraction step 26, the polycrystalline silicon film formed with varying film quality in the laser power monitor portions 22 is measured on an inspection apparatus to determine the optimum laser power value. The thus determined optimum laser power value is then fed back to the laser processing step 25 so that, in the laser processing step 25, the surface of the product substrate 20 that has previously undergone the SPC step 24 is irradiated with a laser at the optimum laser power so that polycrystallization progresses over the entire area of the substrate, yielding high-quality polycrystalline silicon film.

The actual laser power varies with time, and the film quality of the amorphous silicon film formed on the substrate also varies with time. Thus, it is recommended that the optimum power inspection/extraction step 26 be performed every single lot, or every several lots, to control production while precisely controlling the laser power.

If the laser processing is performed at a laser power even slightly higher than the optimum laser power value, re-crystallization of the amorphous silicon film progresses, making it microcrystalline, and thus abruptly degrading the quality of the polycrystalline silicon film. Moreover, since the optimum laser power has a distribution (with a difference of about 5 to about 10 mJ) within the surface of the substrate, with consideration given to the influence of this within-the-surface distribution, performing the laser processing step at a laser power about 5 mJ or about 10 mJ lower than the optimum value makes it possible to produce a stable film for a long period of time.

In the example of the present preferred embodiment, polycrystalline silicon film is formed by the CGS method involving an SPC step 24. Alternatively, it is also possible to utilize any other method, for example one that performs, instead of the SPC step 24, the laser processing step twice. Even when such other methods are used, in the same manner as described above, the optimum laser power can be determined by using a monitor or product substrate before the last laser processing step.

Next, a description will be given below with emphasis placed on the method for determining the optimum laser power value in the optimum power inspection/extraction step 14 shown in FIG. 2.

Figure 5:
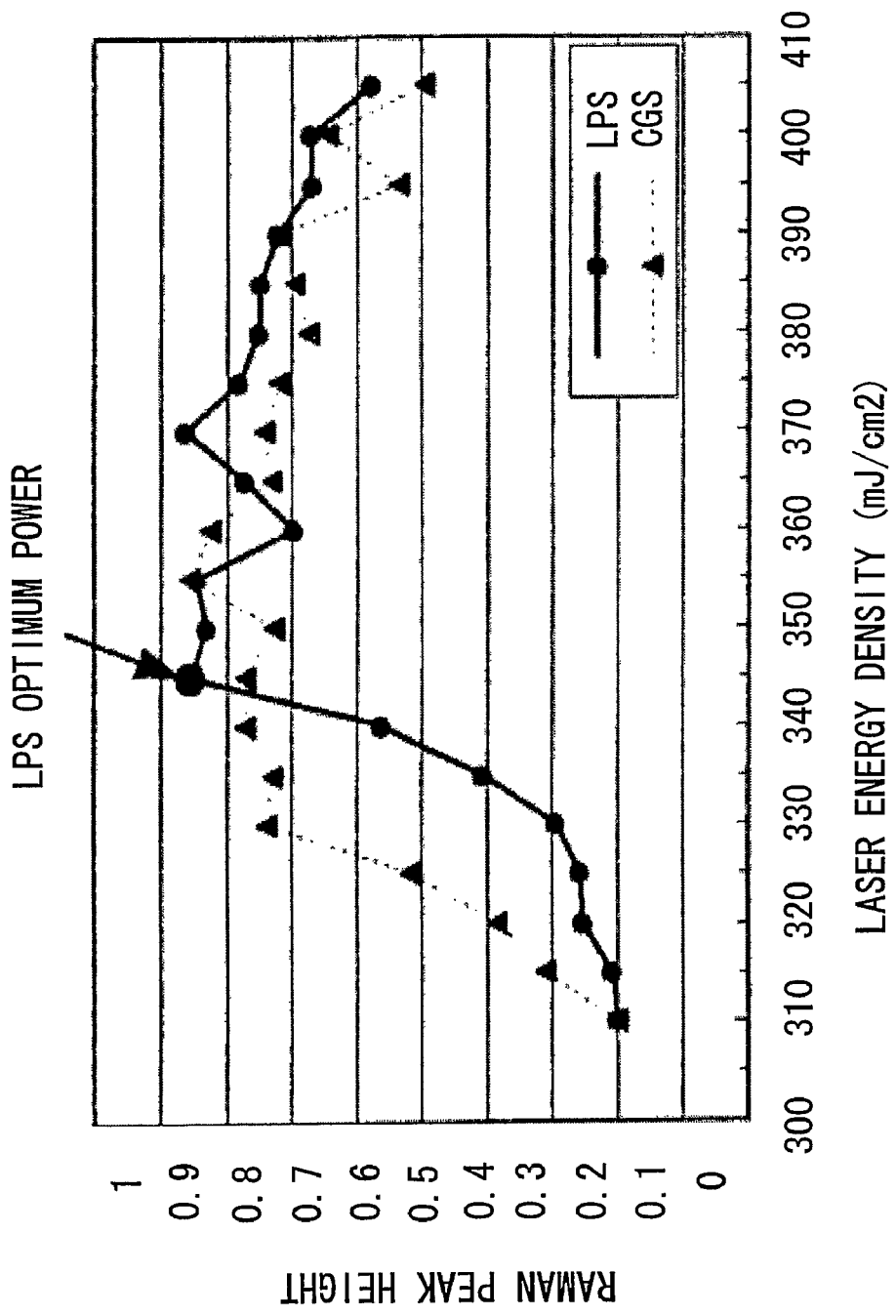
FIG. 5 is a diagram showing the laser energy dependence of the peak height measured by Raman spectroscopy.

FIG. 5 shows measurement results obtained by, as an example of spectroscopy, Raman spectroscopy. The spectrum labeled as LPS in FIG. 5 represents the measurement results obtained with a monitor substrate produced by the conventional process whereby laser processing is performed at different spots at different laser powers on a substrate that has undergone only the amorphous silicon film step 1 (i.e., a monitor substrate produced by the process flow shown in FIG. 1). The spectrum labeled as CGS in FIG. 5 represents the measurement results with a monitor substrate produced by a new process according to a preferred embodiment of the present invention whereby laser processing is performed at different spots at different laser powers on a substrate that has also undergone the SPC step 12 (a monitor substrate produced by the process flow shown in FIG. 2).

As shown in FIG. 5, the LPS spectrum obtained by the conventional process has two or three peaks, of which the first has the value closest to the optimum laser power value, making it possible to determine the optimum laser power. By contrast, the CGS spectrum obtained by the new process has a plurality of peaks, making it difficult to identify the peaks among measurement variations, and with no means available for clearly determining the optimum laser power value as is possible with the LPS spectrum obtained by the conventional process.

The reason that the optimum laser power value cannot be determined is as follows. Raman spectroscopy involves measurement of minute changes in the amount of light, and thus suffers measurement variations. Thus, in particular, as grain size increases during crystallization by laser processing, the projections grow in the polycrystalline silicon film along grain boundaries in such a way as to push up the enlarged crystal grains, increasing the surface irregularities (surface roughness) of the polycrystalline silicon film. This increases measurement variations.

As discussed above, Raman spectroscopy suffers from measurement variations, and thus requires that, at each measurement spot, the mean value of 10 measurements taken is calculated as the measurement value, resulting in a long measurement time.

Figure 6:
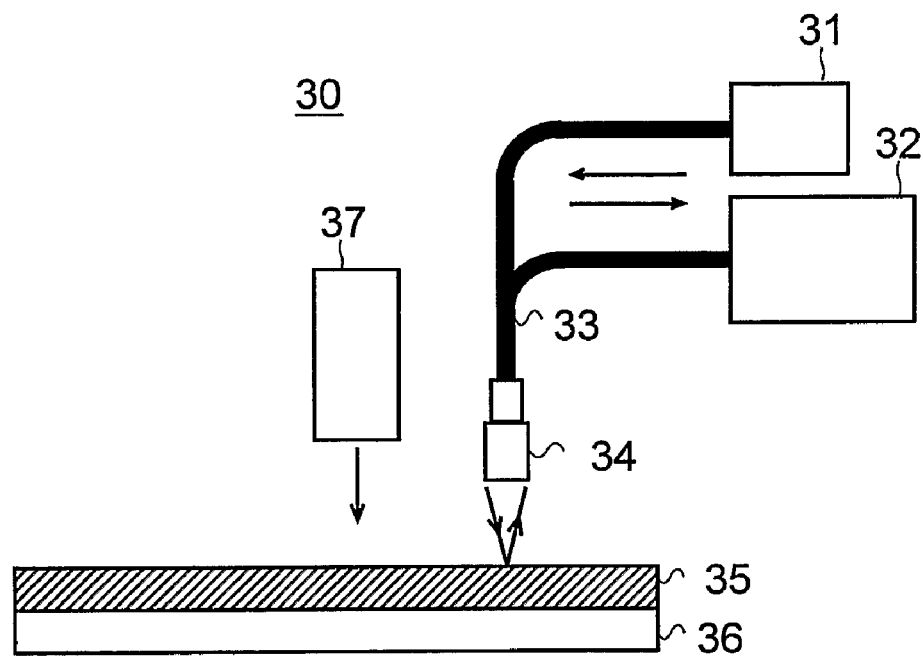
FIG. 6 is a diagram illustrating a monitoring apparatus employing spectroscopy different from Raman spectroscopy.

Next, a description will be given of an example of monitoring based on spectroscopy different from Raman spectroscopy discussed above. FIG. 6 is a diagram illustrating the principle of monitoring based on spectroscopy different from Raman spectroscopy.

The spectroscopic analysis apparatus 30 shown in FIG. 6 is provided with a light source box 31 that emits light, a spectroscope 32 that receives reflected light, light-irradiation and light-reception optical fibers 33 that transmit light, and a head 34 that shines and receives light to and from a substrate substantially perpendicular thereto. The light-irradiation and light-reception optical fibers 33 are, at first ends, bundled together and connected to the head 34.

Figure 7:
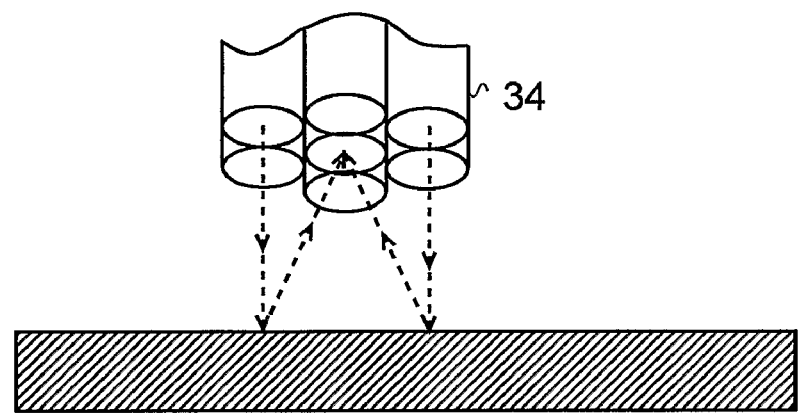
FIG. 7 is an enlarged view of the tip of the head of a spectroscopic analysis apparatus employing spectroscopy different from Raman spectroscopy.

FIG. 7 shows an enlarged view of the tip of the head 34 shown in FIG. 6 and the arrangement of the optical fibers at the tip of the head 34. At the center of the tip of the head 34, a light-reception optical fiber 33 is arranged in a light-reception head 34*a*, and, around this, light-irradiation optical fibers 33 (in this preferred embodiment, six) are arranged in light-irradiation heads 34*b* at equal angular intervals.

When light shines on the substrate 36 substantially perpendicular thereto and the light-irradiation portions are arranged right above the circumference of the measurement spot as described above, even if the crystal structure of the measured substrate is anisotropic, no measurement errors occur in the direction in which the measurement system is aligned. Even if there is a warp in the substrate, as is the case with a large-size substrate, and thus there are variations in angular deviation from the vertical direction at the measurement spot, errors can be minimized to achieve accurate measurement.

Although the above description deals with an example of a reflection-type construction, it is also possible to use a transmission-type construction in a case where the substrate 36 and the film 35 provided thereon are made of a material transparent to light, such as glass. A reflection-type construction, however, permits the heads and fibers to be integrated together, and thus permits easy alignment combined with a compact arrangement.

Figure 8:
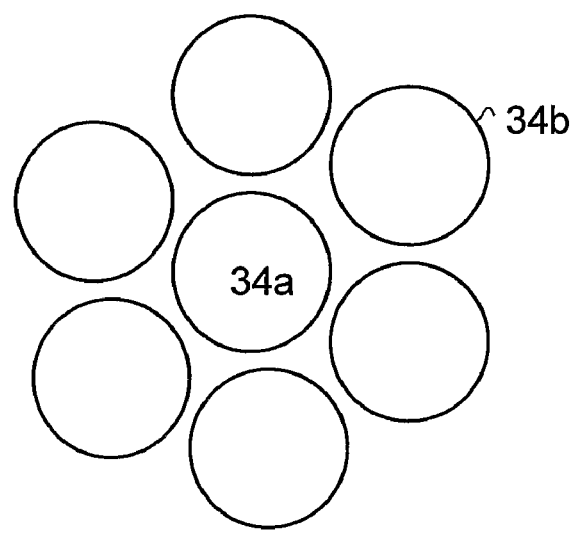
FIG. 8 is a diagram showing the arrangement of optical fibers at the tip of the head of the spectroscopic analysis apparatus employing spectroscopy different from Raman spectroscopy.

A description will be given below of the principle of the measurement performed on the spectroscopic analysis apparatus 30 shown in FIGS. 6, 7, and 8. The light emitted from the light source box 31 passes though the light-irradiation optical fibers 33 and then exits from the light-irradiation heads 34*b* so as to strike the surface of the substrate substantially perpendicularly thereto. The light that has struck the substrate is reflected from the surface thereof, enters the light-reception head 34*a*, and passes through the light-reception optical fiber 33 so as to be spectroscopically analyzed by the spectroscope 32, which thus yields the wavelength distribution curve of the reflectivity of the reflected light. Based on this measurement result, the crystallinity of the film 35 on the substrate is analyzed.

It is preferable to provide, in inspection using imaging described later, an imaging camera 37 that inspects the pattern of the film 35 on the substrate to evaluate whether the laser power is excessive or insufficient. For example, the imaging camera 37 can be shared with, for example, a camera provided in mass-production equipment to observe markers on the substrate for the purpose of positioning. This helps reduce the cost and installation space.

The spectroscopic analysis apparatus 30 shown in FIG. 6 can be compactly installed to perform measurement, with the optical fibers 33 along with the head 34 extending to the measurement spot. It can be incorporated into the laser processing equipment, for example, between the receiving/delivering portion and the cleaning apparatus thereof.

Moreover, it is possible to choose a spectroscopic analysis wavelength different from the laser wavelength used in laser processing. Thus, by using analysis light in the wavelength range of the visible spectrum region, i.e., about 400 nm and higher, it is possible, for example while performing laser processing inside the laser processing equipment (for example, with a XeCl laser with a wavelength of 308 nm), to accurately inspect, on a real-time basis and instantaneously, the film quality in the portion having already undergone laser processing. Thus, it is even possible to perform mass-production processing of the substrate being irradiated with a laser while performing in-situ monitoring of a laser in a small gap (for example, about mm) between the monitor portion and the laser processing portion so that the laser power is kept at the optimum value. In fact, the measurement wavelength is different from the wavelength range of the laser light used in the laser processing, and therefore it is possible to perform in-situ monitoring.

Examples of the spectroscopic analysis apparatus 30 used in this measurement include a spectroscopic analysis apparatus having light-irradiation and light-receiving heads integrated together, for example model F20 manufactured by Filmmetrics and distributed by Matshushita Intertechno (Co., Ltd.); a type having separate light-irradiation and light-receiving heads, for example model Z5FM manufactured by Omron; and a type that permits inspection of linear batch inspection and permits efficient measurement evaluation processing when evaluation is performed visually, for example model ImSpecteror manufactured by Kawatetsu Technoreserch. Any other type of apparatus may be used instead. For automatic detection and evaluation, however, it is necessary to prepare an evaluation system program like the one described later.

Figure 1:
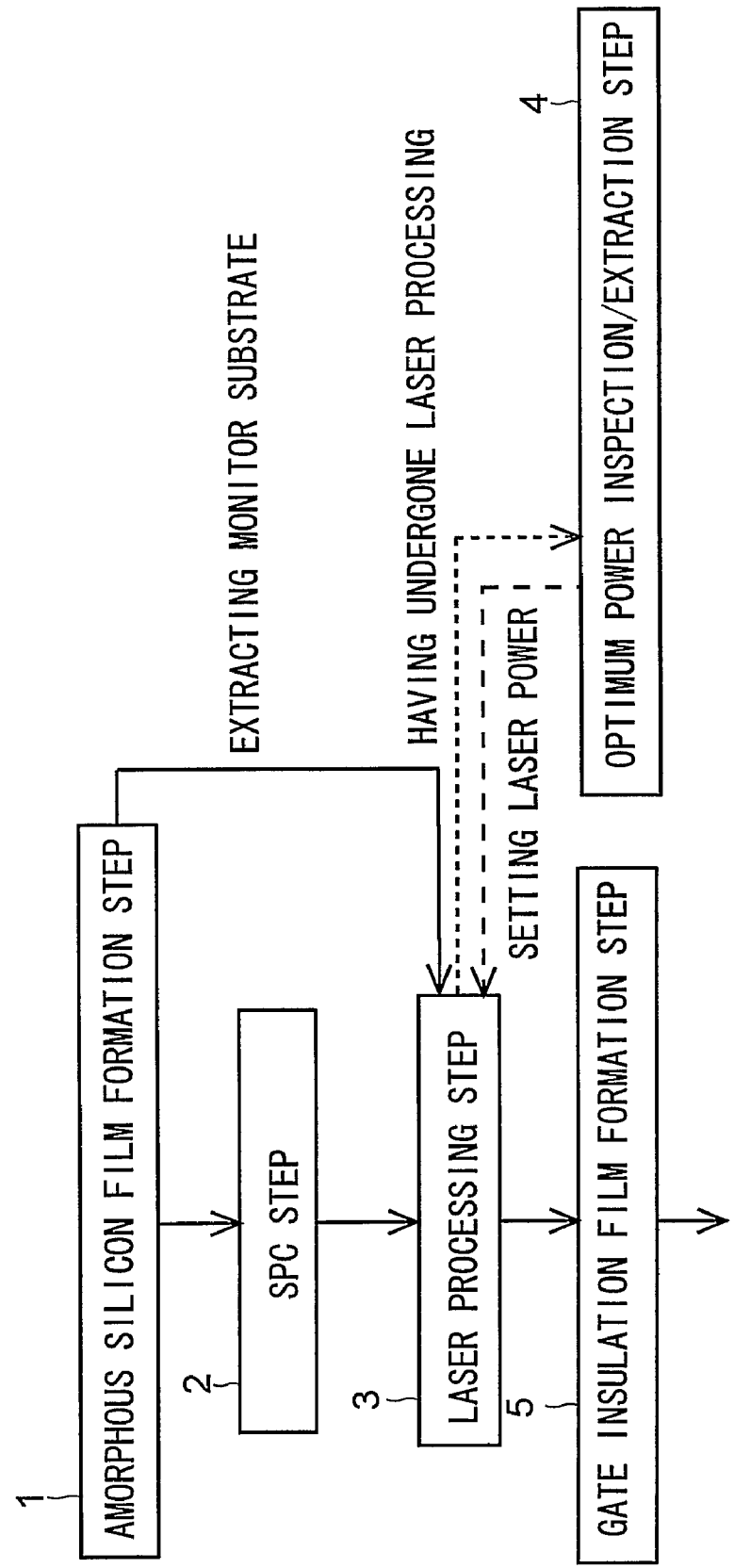
FIG. 1 is a process flow chart showing the process flow of a conventional process.
Figure 9:
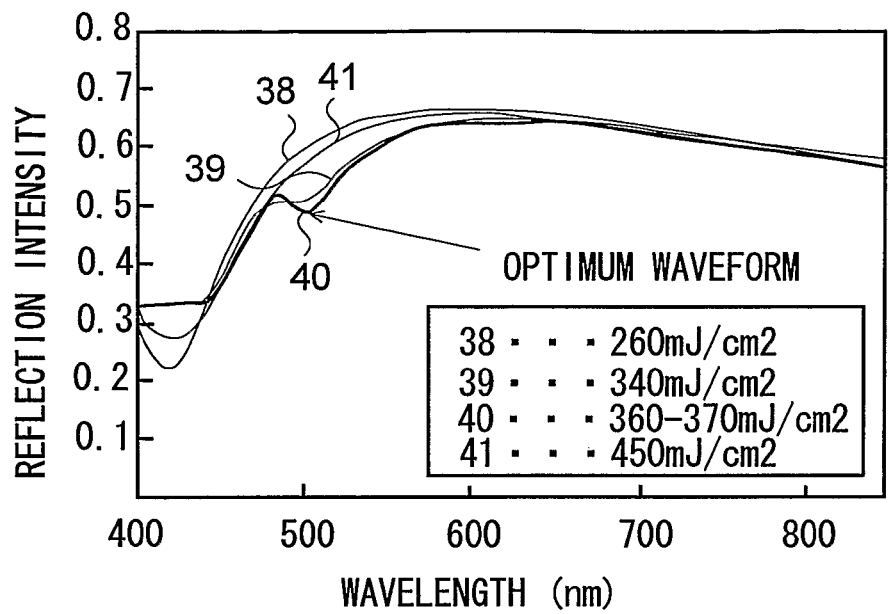
FIG. 9 is a diagram showing the wavelength dependence of the reflection intensity measured by spectroscopy different from Raman spectroscopy in monitor substrates processed by a conventional process.

FIG. 9 shows an example of the spectroscopic characteristics as actually measured on Filmmetrics' model F20, which operates on the same principle as the spectroscopic analysis apparatus 30 shown in FIG. 6 with the polycrystalline silicon thin film obtained by crystallizing, while the laser power is varied from 260 mJ/cm$^2$ to 450 mJ/cm$^2$, the amorphous silicon film on a monitor substrate produced by the conventional process flow shown in FIG. 1.

Shown here is how the spectroscopic characteristics profile varies as the laser power is stepped up in a plurality of stages. Of all the spectra shown here, the spectrum 40 obtained at a laser power of about 360 mJ/cm$^2$ to about 370 mJ/cm$^2$ and having a maximum and a minimum at sub peaks is the spectrum of the polycrystalline silicon film in its optimum crystal state. In the laser power range of this example, the minimum and maximum have a minimum at a wavelength of slightly higher than 400 nm and the peak value of a maximum around 600 nm, exhibiting a comparatively gently-sloped profile. As the laser power is increased from the lowest laser power, namely 260 mJ/cm$^2$ (the spectrum 38), a maximum appears at about 480 nm, and the sub peak of a minimum appears at about 520 nm. This trend becomes gradually noticeable until, over a laser power of about 360 mJ/cm$^2$ to about 370 mJ/cm$^2$, i.e., that of the optimum crystal state (the spectrum 40), the sub peak becomes less and less noticeable until it disappears. Thus, by visual evaluation achieved by comparison of spectrum profiles, it is possible to determine the optimum laser power (in this evaluation by comparison, the shift of the profile resulting from variations in the amount of light from the light source can be ignored).

However, with consideration given to the variation of the measured spectroscopic profile resulting from a decrease in the amount of light from the light source, variations in the characteristics of the spectroscopic sensor, and other factors, and to permit automatic measurement/evaluation of crystallization in mass-produced products for a long period of time, it is preferable to set a fixed-quantity value that can be calibrated.

Figure 10:
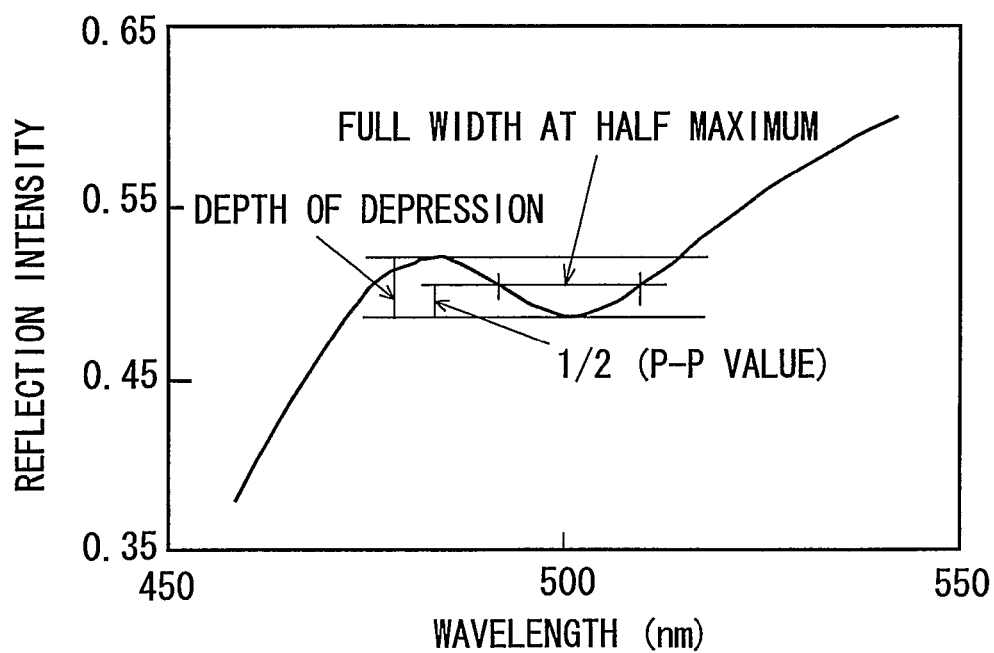
FIG. 10 is a diagram illustrating an example of how the fixed-quantity value is calculated from measurement results.
Figure 11:
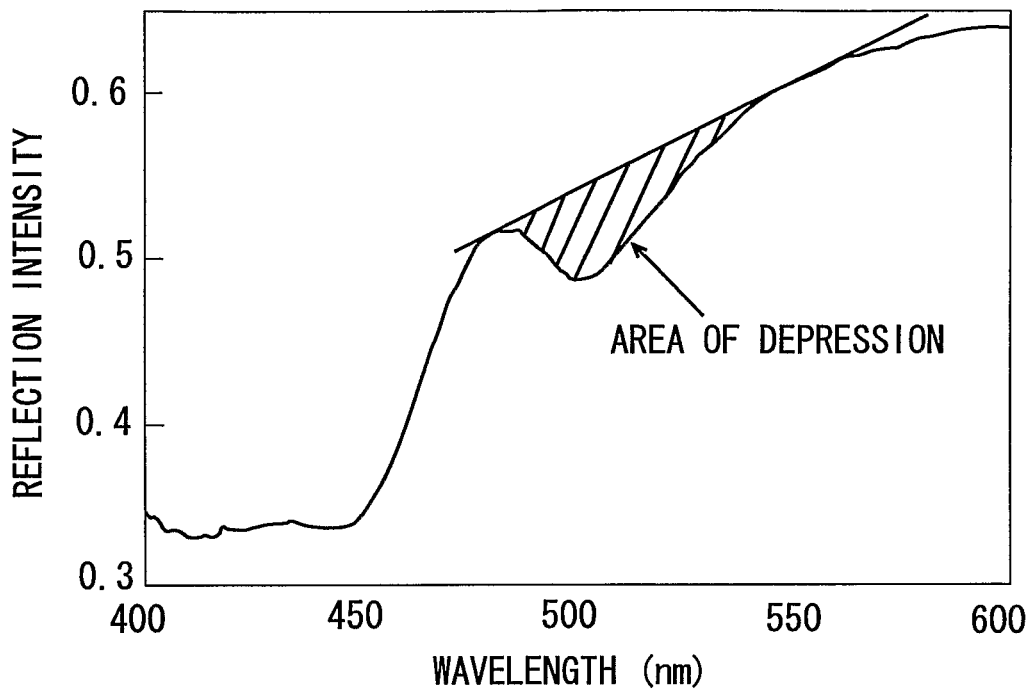
FIG. 11 is a diagram illustrating another example of how the fixed-quantity value is calculated from measurement results.

Examples of the value at which the above fixed-quantity value can be set include, among many others 1) a maximum in reflective intensity (for example, the maximum around a wavelength of slightly higher than 500 nm shown in FIG. 9); 2) the depth of a depressed portion (see FIG. 10); 3) a full width at half maximum of a depressed portion (see FIG. 10); 4) the area of a depressed portion (the area enclosed by a tangent line and the measured curve as shown in FIG. 11); and likewise, 5) the height, full width at half maximum, or area of an elevated portion at a wavelength of slightly lower than 500 nm. In the study actually conducted with the preferred embodiments of the present invention, it was confirmed that the above item 4), i.e. the maximum of the area of a depressed portion has the least error from the optimum crystal state and is thus applicable to mass production.

Figure 12:
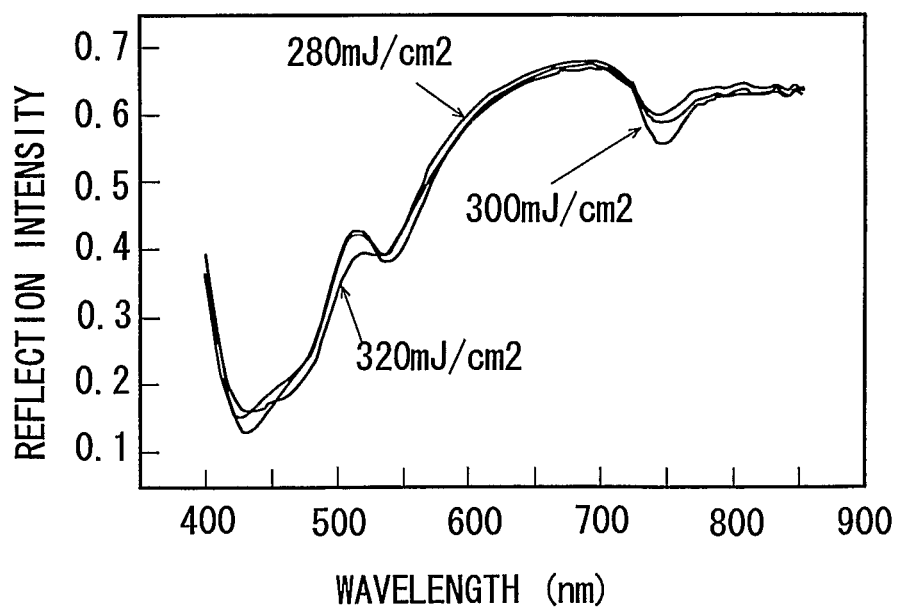
FIG. 12 is a diagram showing the wavelength dependence of the reflection intensity measured by spectroscopy different from Raman spectroscopy in monitor substrates processed according to a preferred embodiment of the present invention.

FIG. 12 shows an example of the spectroscopic characteristics as actually measured on Filmmetrics' model F20, which operates on the same principle as the spectroscopic analysis apparatus 30 shown in FIG. 6, with the polycrystalline silicon thin film obtained by crystallizing, while the laser power is varied from 280 mJ/cm$^2$ to 320 mJ/cm$^2$, the amorphous silicon film having undergone the SPC step 12 produced by the process flow shown in FIG. 2. In the spectra shown in FIG. 12, the trend around the wavelength of about 500 nm is similar to that exhibited by the spectra shown in FIG. 9, i.e., those measured with polycrystalline silicon film produced by the conventional process, and thus permits the determination of the optimum laser power.

The spectroscopic characteristics of the polycrystalline silicon film produced by the process flow shown in FIG. 2 differ from those of the polycrystalline silicon film produced by the conventional process flow shown in FIG. 1 in that a depressed portion (a minimum) is formed at the wavelength of about 750 nm in FIG. 12. The fixed-quantity value may be set by applying the above-described method of determining the fixed-quantity value to this variation in the spectrum around the wavelength of about 750 nm.

If a substrate that has been defectively processed by the SPC step is subjected to this measurement, analyzing it in the wavelength range around 700 nm to around 800 nm reveals that it exhibits a spectrum different from that of an acceptable substrate. This makes it possible to automatically recognize such a defective substrate as not permitting the determination of the optimum laser power. Thus, it is possible to quickly detect an SPC step defect, and thereby to reduce production losses that would result if detective substrates are continued to be fed to the succeeding steps until a SPC step defect was detected.

Figure 13:
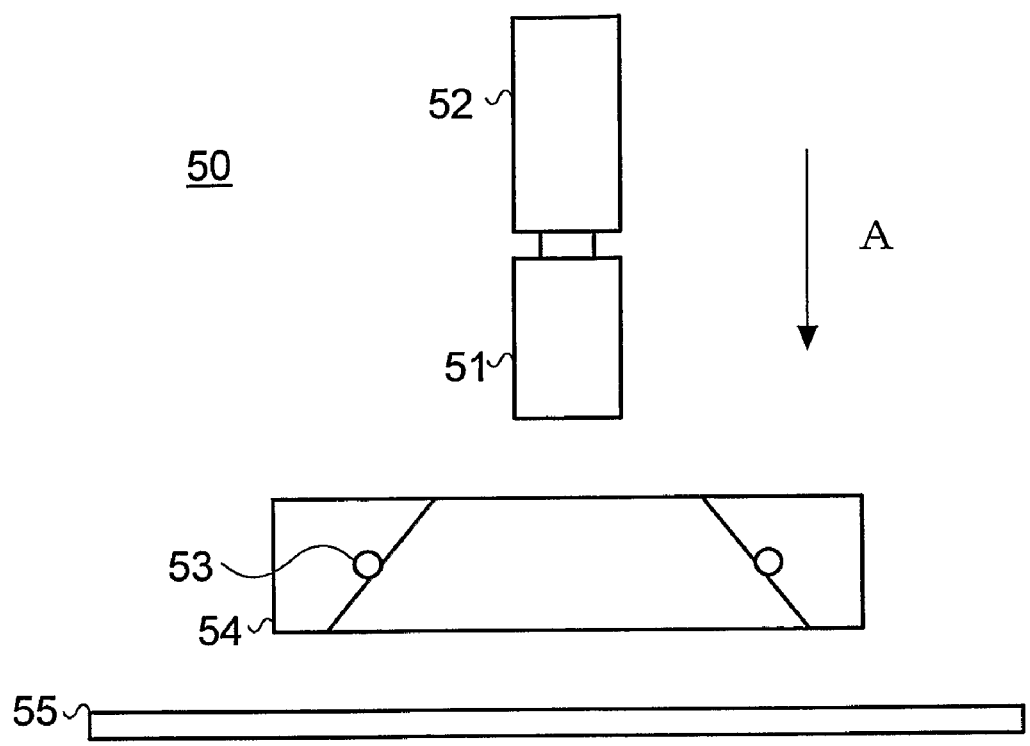
FIG. 13 is a diagram illustrating an example of a monitoring apparatus employing imaging.

Next, a description will be given of an example of imaging as one method for determining the optimum laser power value in the optimum power inspection/extraction step 14. FIG. 13 shows a monitoring apparatus that employs imaging.

The monitoring apparatus 50 employing imaging shown in FIG. 13 has a magnifying lens 51 that magnifies an image, a camera 52 that has the magnifying lens 51 provided in the front thereof, LEDs 53 that irradiate a substrate surface with light, and an illuminating member 54 that has the LEDs 53 arranged in a square parallel to the substrate surface.

A description will be given below of the principle of the measurement performed by the monitoring apparatus 50 employing imaging shown in FIG. 13. The light emitted from the LEDs 53 shines on, by the illuminating member 54, measurement spots on a substrate 55 evenly from the periphery thereof. The light that strikes the substrate is reflected from the surface thereof, passes through the magnifying lens 51 disposed above the substrate surface substantially perpendicular thereto, and is then converted into an image by the camera 52. Based on the brightness and the number of bright lines in a predetermined field of vision in the image, the optimum laser power value is determined so that the peak value of the brightness coincides with the optimum laser power.

The camera 52 can correctly evaluate crystallinity when it acquires an image from the direction perpendicular to the surface of the substrate 55, and therefor, in this example, model CS8320 manufactured by Tokyo Denshi Kogyo was used in combination with, as the magnifying lens 51, model MTE-55 manufactured by Moritechs. With the effective field of vision measuring 13 mm×9.75 mm, this permits measurement in a wide field of vision relative to the nucleus of a crystal having an order of several μm, and thus permits measurement with minimum errors without the influence of positioning errors and the like in the measurement apparatus.

When evaluation is performed by the use of a monochrome camera or the like, it is preferable to use white light as the illumination light because this significantly increases the brightness of the image relative to crystallinity, and illuminated spots need to be arranged in fixed positions relative to the measurement spots. Moreover, illuminating the surface of the substrate 55 from a direction oblique thereto makes it possible to reflect surface projections due to crystallinity, and thus makes stable evaluation possible. An illumination angle in the range from about 30° to about 60°, preferably around 45°, permits particularly accurate and stable measurement. When the LEDs 52 are arranged as shown in FIG. 13, the illumination angle varies slightly in the above-mentioned range, but nevertheless, by using model KDBW-Q360C manufactured by Moritechs (with white LEDs manufactured by Nichia Kagaku Kogyo), it was possible to perform satisfactory crystal evaluation.

Figure 14:
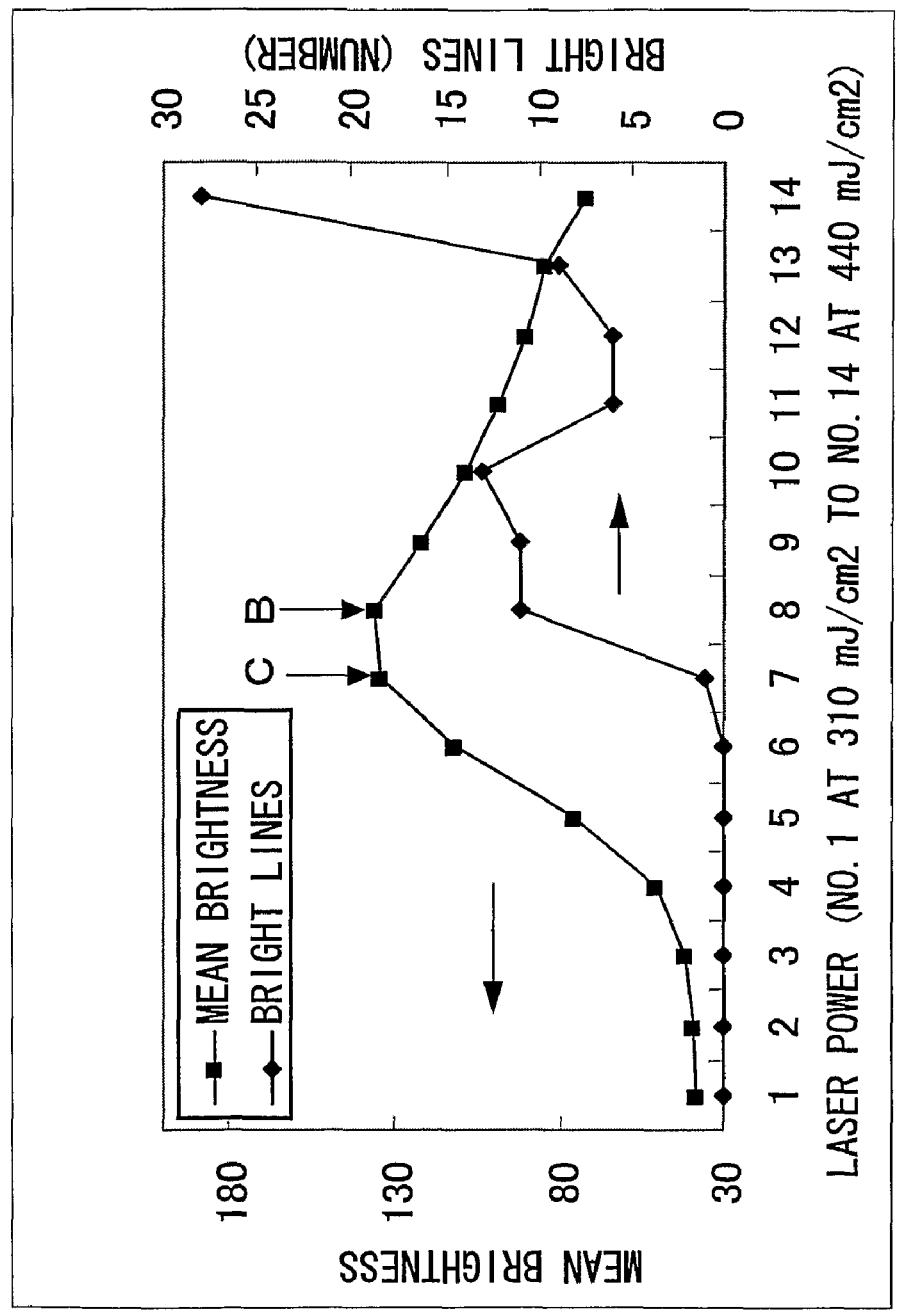
FIG. 14 is a diagram showing the laser power dependence of the brightness and the number of bright lines measured on the monitoring apparatus employing imaging.

FIG. 14 shows the results of imaging-based measurement of the mean brightness and the number of bright lines performed on a polycrystalline silicon film obtained by performing laser processing, while the laser power was varied from 370 mJ/cm$^2$ to 440 mJ/cm2, on a monitor substrate produced, up to the SPC step 12, by the process flow shown in FIG. 2. The optimum laser power value falls between the laser power values of about 370 mJ/cm$^2$ to about 380 mJ/cm$^2$ as a maximum. Thus, also on the basis of the results of imaging-based measurement of brightness, it is possible to evaluate and determine the optimum laser power.

If the laser power becomes even slightly higher than the optimum laser power value at which laser processing is performed, re-crystallization of the amorphous silicon film progresses making it microcrystalline, and thus abruptly degrading the performance and quality of polycrystalline silicon film. Moreover, since the optimum laser power has a distribution (with a difference of about 5 mJ to about 10 mJ) within the surface of the substrate, with consideration given to the influence of this within-the-surface distribution, performing the laser processing step at a laser power about 5 mJ or about 10 mJ lower than the optimum value makes it possible to produce a stable film for a long period of time. For example, when the optimum laser power B is detected in FIG. 14, the processing laser power C is set as the laser power at which to perform the laser processing step 13.

Figure 16:
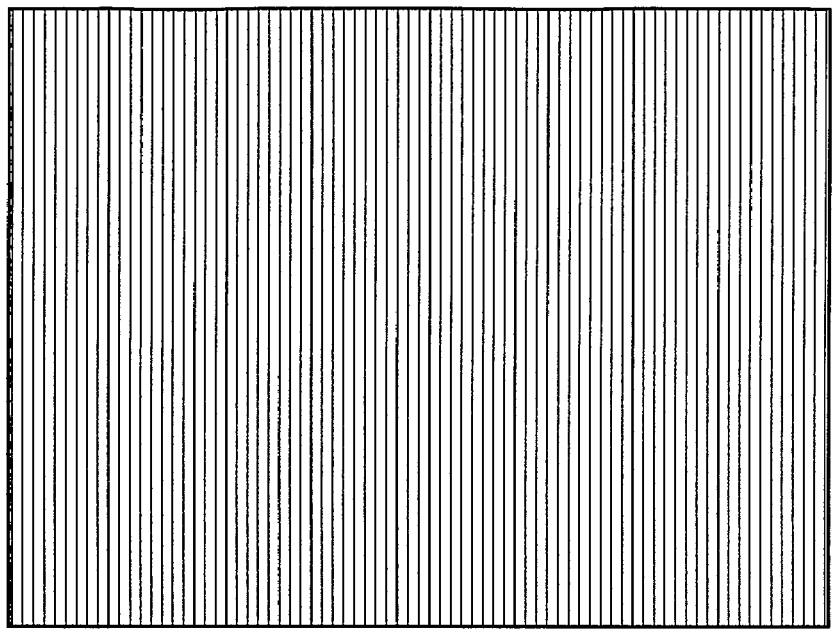
FIG. 16 is a schematic diagram of an image of acceptable polycrystalline silicon film as observed on the image monitoring system.

Next, a description will be given of the bright lines measured by the imaging shown in FIG. 14. FIG. 16 is a schematic diagram of a streaked pattern produced when laser processing is performed with a laser irradiation width smaller than the substrate surface. This streaked pattern is measured as the number of bright lines shown in FIG. 14, and the number of bright lines noticeably increases only when the laser power is higher than the optimum vale. Thus, the results of measuring bright lines can also be used to evaluate the optimum laser power. However, it should be noted that the number of streaks varies with the illumination brightness, the automatic image processing software that is used for automatic counting, the laser spots, the substrate processing process, and other factors, and therefore the absolute number of streaks is not as significant as its presence. To make the number significant, it is necessary to devise a reference system.

By using as a reference the value of the brightness measured when laser processing is performed at the optimum lower power and comparing it with the brightness measured with a newly produced product substrate, it is possible to evaluate whether the actual laser power is too low or too high relative to the optimum laser power.

The monitoring apparatus 50 employing imaging, too, can be compactly installed to perform measurement, with optical fibers extending from the main unit of the apparatus to the measurement spot. It can be incorporated into the laser processing equipment, for example, between the entrance/exit portion and the cleaning apparatus thereof.

The above-described measurement employing spectroscopy different from Raman spectroscopy or employing imaging permits acquisition of sufficient data when performed only once under a given set of conditions, and thus helps reduce the measurement time as compared with Raman spectroscopy, which needs to be performed a plurality of times under a given set of conditions.

The monitoring apparatus 50 employing imaging shown in FIG. 13 can share, with the monitoring apparatus employing spectroscopy shown in FIG. 6, the method of detecting an excess of the laser power (the above-described method for evaluating and determining the optimum laser power), hardware (the light source, etc.), and software (for data processing and display). Thus, the monitoring apparatus 50 can be made compact, and makes in-line inspection easy. In the optimum power inspection/extraction step 14, both monitor and product substrates may be inspected on a monitoring apparatus that employs both imaging and spectroscopy, as will be described later.

The above-described spectroscopic analysis apparatus 50 employing imaging shown in FIG. 13 may be used as an image monitor for detecting foreign objects and SPC step defects in the optimum power inspection/extraction step 14. This makes it possible to quickly detect a foreign object or an SPC step defect, and thereby to reduce production losses. The image monitor can share the camera 52 shown in FIG. 13 so as to be arranged compactly and inexpensively, on the other hand, it may be provided separately.

Figure 15:
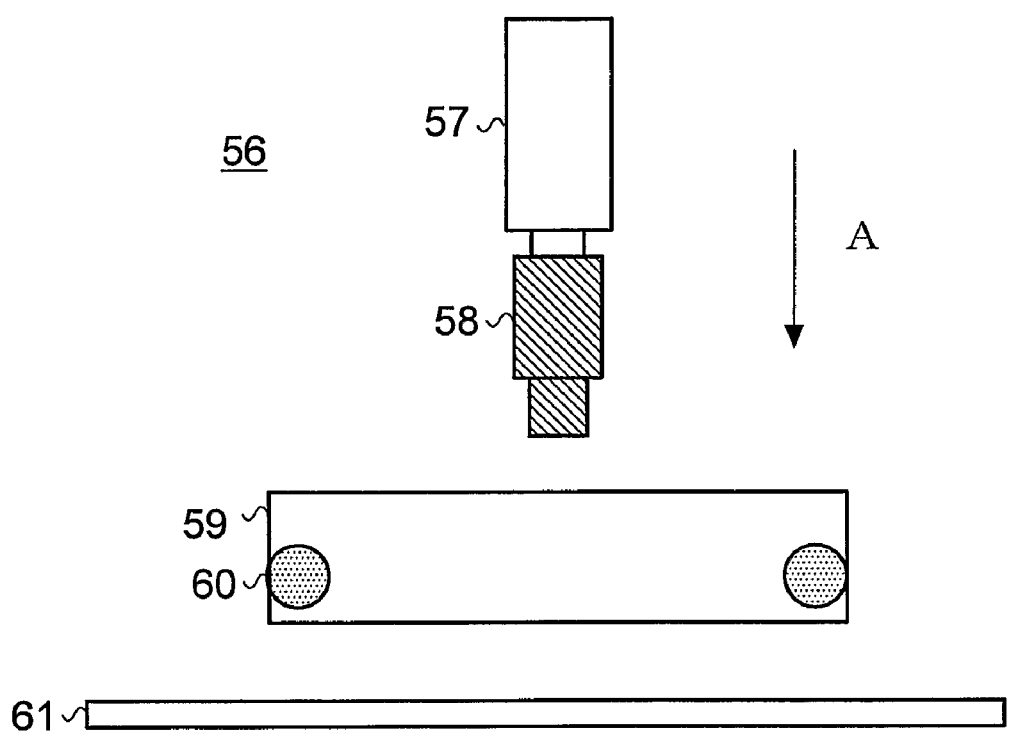
FIG. 15 is a diagram showing an example of an image monitoring system for detecting foreign objects and SPC step defects.

FIG. 15 shows an example of an image monitoring system for detecting foreign objects and SPC step defects. The image monitor system 56 includes an Olympus-made microscope 58 provided with a 5× objective lens, a Tokyo Denshi Kogyo-made model CS8420 camera 57 that converts the image of the microscope into an image, a ring-shaped fluorescent lamp 60 that shines light to a substrate surface, and an illumination member 59 that has the fluorescent lamp 60 arranged parallel to the substrate surface.

In the image monitor system 56, the light emitted from the fluorescent lamp 60 shines on, by the illumination member 59, measurement spots on a substrate 61 evenly from the periphery thereof. The light that strikes the substrate is reflected from the surface thereof, passes through the microscope 58 disposed above the substrate surface substantially perpendicularly thereto, and is then converted into an image by the camera 57. By observing this image, it is possible to detect foreign objects and SPC step defects.

Figure 17:
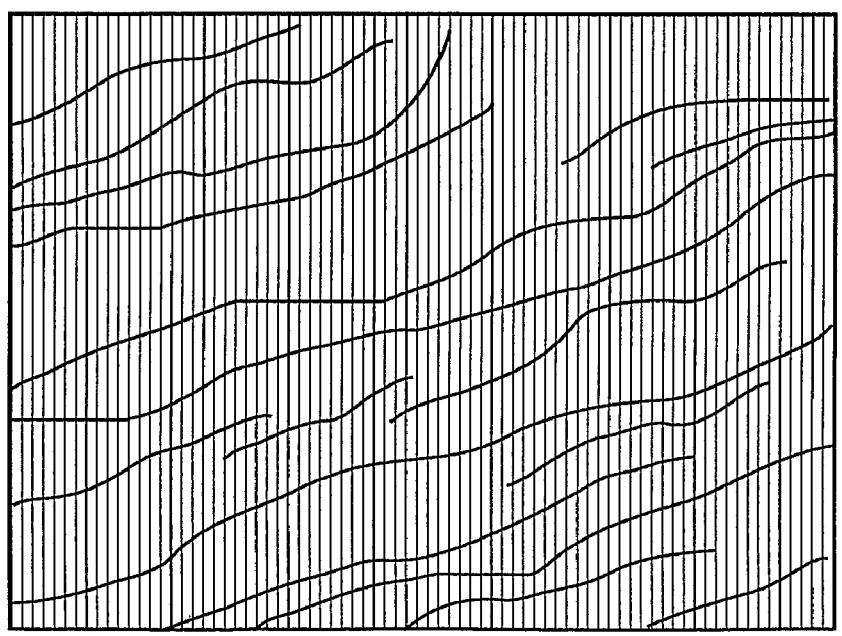
FIG. 17 is a schematic diagram of an image of polycrystalline silicon film with SPC step defects as observed on the image monitoring system.

As examples of measurement results obtained when polycrystalline silicon film produced by the process flow shown in FIG. 2 and having undergone the SPC step 12 is measured with the image monitor, FIG. 16 shows a schematic diagram of an image obtained with an accepted product, and FIG. 17 shows a schematic diagram of an image of an SPC step defect. Whereas a streaked pattern formed by laser processing is observed with the accepted product, a net-like pattern ascribable to uneven SPC step processing is observed with the SPC step defect-ridden product.

Figure 18:
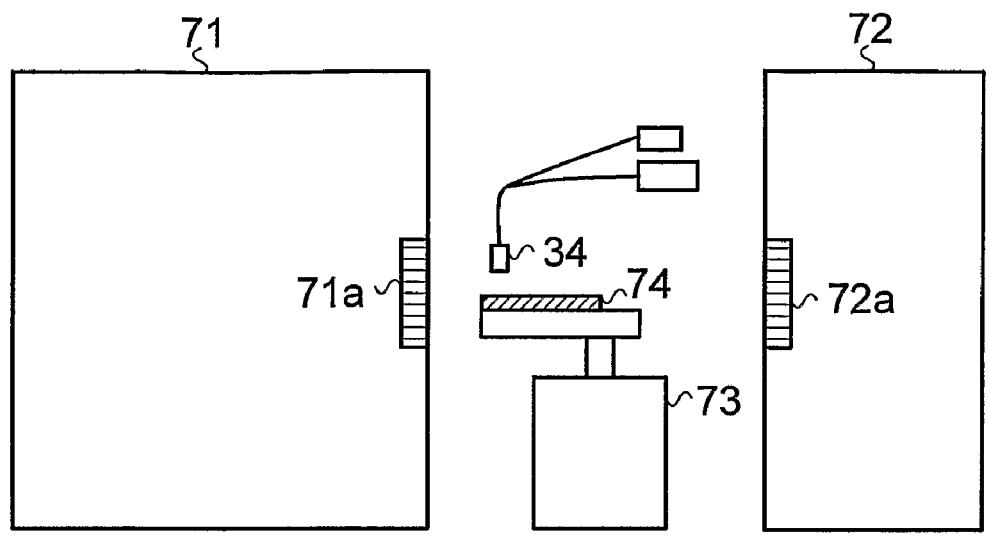
FIG. 18 is a diagram illustrating how individual apparatuses are arranged when measurement is performed by spectroscopy or imaging near the laser processing equipment.

Next, a description will be given of a method of increasing the speed of feedback of the optimum laser power to the laser processing equipment. This can be achieved by performing measurement employing spectroscopy or imaging near the laser processing equipment, and has a great effect, in particular, in a case where monitor substrates are no different from mass-produced substrates (i.e., product substrates). This permits laser processing for mass production to be performed quickly after measurement, and permits the time-related instability of the laser light source to be compensated for. This eventually makes it possible to enhance and stabilize the performance of polycrystalline silicon film. FIG. 18 shows an example of how measurement employing spectroscopy is performed near laser processing equipment.

As shown in FIG. 18, between laser processing equipment 71 and a receiving/cleaning apparatus 72 installed in front of the laser processing equipment 71 for the purpose of cleaning substrates, a substrate transport robot 73 is installed. In a space near a side inlet 71a and a side outlet 72a of the substrate transport robot 73 of the laser processing equipment 71, for example in a case where the spectroscopy-based method shown in FIG. 6 is used, a measurement head 34 is arranged, with optical fibers extending from the main unit. The measurement head may be that for an imaging-based method.

By measuring a substrate 74 on the substrate transport robot 73, it is possible to perform measurement at desired spots while freely changing the measurement spots from one model to another.

Figure 19:
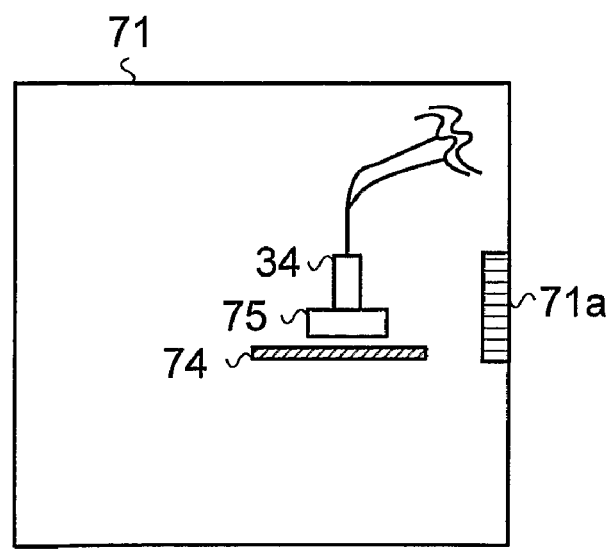
FIG. 19 is a diagram illustrating how individual apparatuses are arranged when measurement is performed by spectroscopy or imaging inside the laser processing equipment.

Alternatively, as shown in FIG. 19, inside the laser processing equipment 71, for example in a case where the spectroscopy-based method shown in FIG. 6 is used, a head 34 may be arranged, with optical fibers extending from the main unit. This permits measurement to be performed without the need to once deliver substrates and then receive them back, and thus helps save time. In this case, however, it is necessary to select light of a wavelength that can be analyzed without being influenced by the wavelength of the laser light of the laser processing equipment 71, or to place a filter that blocks the wavelength of the laser light of the laser processing equipment 71, or arrange a light-shielding member 75 around the head 34.

A description will be given below of a method of more stably producing polycrystalline silicon film. In the optimum power inspection/extraction step, it is preferable to use an inspection apparatus provided with both a function for inspecting product substrates and a function of automatically evaluating and determining the optimum laser power from the laser power inspection results obtained by the spectroscopy-based system shown in FIG. 6, the imaging-based system shown in FIG. 13, or the like and then automatically feeding it to the laser processing equipment 71. This makes the inspection apparatus compact, and in addition helps eliminate human errors that are likely to occur when, as conventionally practiced, humans read the result of the optimum laser power from the measured spectrum to set the laser power at which to perform laser processing in a case where a plurality of pieces of laser processing equipment 71 is installed, or where different models requiring different optimum laser powers are mixed in the same line. Moreover, automatic setting of the optimum laser power at which to perform laser power ensures that the optimum laser power is reflected efficiently.

Figure 26:
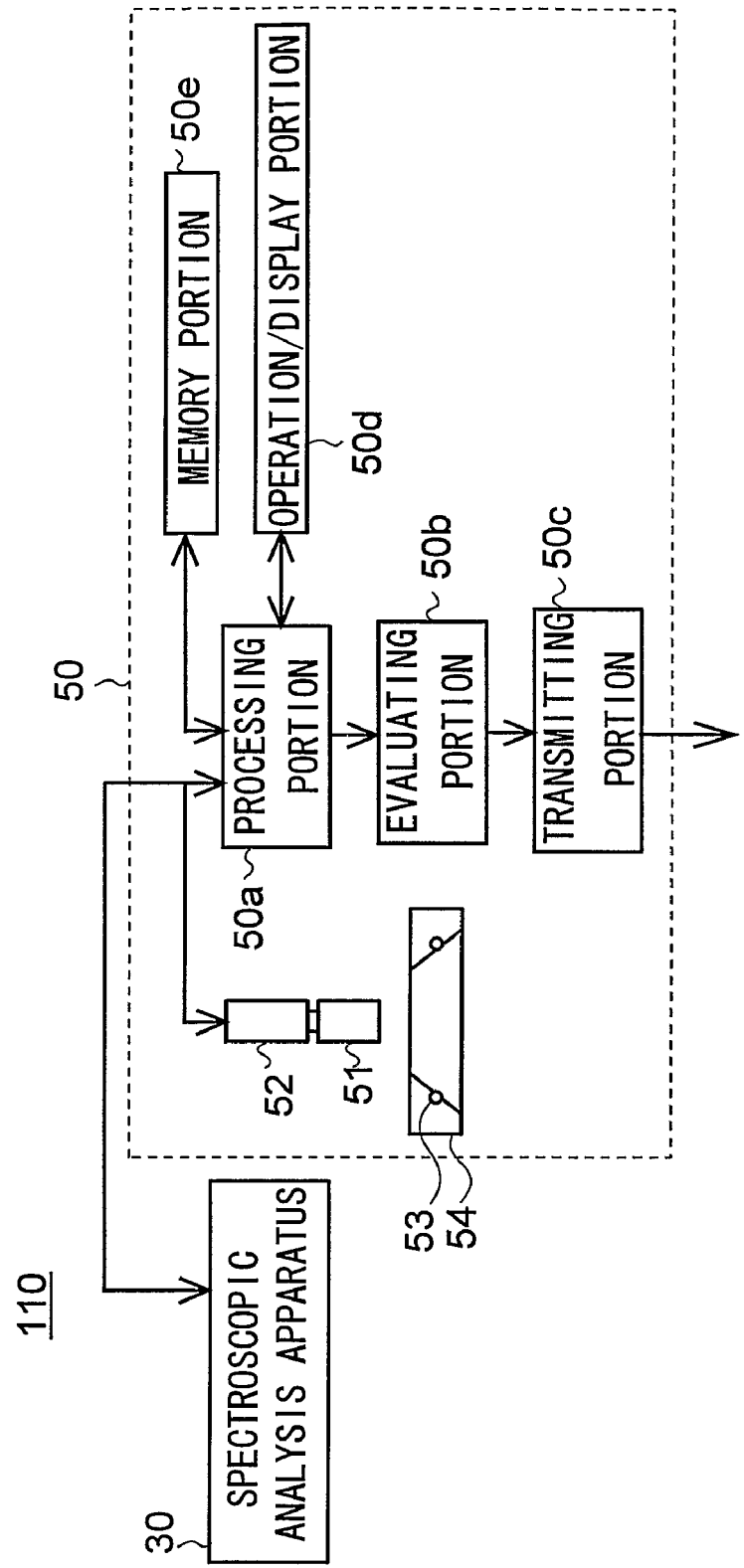
FIG. 26 is a diagram showing the configuration of a principal portion of a dual-method monitoring apparatus provided with a monitoring apparatus employing imaging and a spectroscopic analysis apparatus.

For example, a dual-method monitoring apparatus as described below is provided with both imaging-based and spectroscopy-based inspection functions. FIG. 26 is a diagram showing the configuration of a principal portion of a dual-method monitoring apparatus provided with a monitoring apparatus 50 employing imaging and a spectroscopic analysis apparatus 30. As shown in FIG. 26, the dual-method monitoring apparatus 110 has a spectroscopic analysis apparatus 30 and a monitoring apparatus 50 employing imaging.

The monitoring apparatus 50 employing imaging has (in addition to the already-mentioned components, namely a magnifying lens 51 that magnifies the light it receives, a camera 52 that converts the light it receives into image data, LEDs 53, and an illuminating member 54) a processing portion 50a that controls the entire apparatus and that performs data processing, quantification and graphic representation on the spectroscopic data fed from the spectroscopic analysis apparatus 30 and the image data read from the camera 52; a memory portion 50e that stores evaluation conditions against which to evaluate and determine the optimum laser power value for the laser processing equipment 71 based on the results of the data processing performed by the processing portion 50a, various control programs, data processing programs related to spectroscopy and imaging, and various kinds of data; an evaluating portion 50b that evaluates and determines, based on the results of the data processing performed by the processing portion 50a, the optimum laser power value for the laser processing equipment 71, whether or not there is an SPC step defect or a foreign object on the substrate, etc.; an operation/display portion 50d that displays the results of the data processing performed by the processing portion 50a, the optimum laser power value evaluated and determined by the evaluating portion 50b, etc. and that accepts entry of operations into the dual-method monitoring apparatus 110; and a transmitting portion 50c that establishes a connection with an external apparatus for communication therewith and that feeds the optimum laser power value for the laser processing equipment 71 as evaluated and determined by the evaluating portion 50b to the external apparatus (for example, the laser processing equipment 71). Alternatively, a separately built monitoring apparatus 50 employing imaging or a spectroscopic analysis apparatus 30 may be used so that the optimum laser power value for the laser processing equipment 71 as evaluated and determined by the evaluating portion 50b based on the results of the data processing by the processing portion 50a is fed from the transmitting portion 50c to an external apparatus (for example, the laser processing equipment 71). Instead of the magnifying lens 51, camera 52, LEDs 53, and illuminating member 54 provided in the monitoring apparatus 50; the microscope 58, camera 57, fluorescent lamp 60, and illumination member 59 provided in the image monitor system 56 shown in FIG. 15 described earlier may be used.

Figure 20:
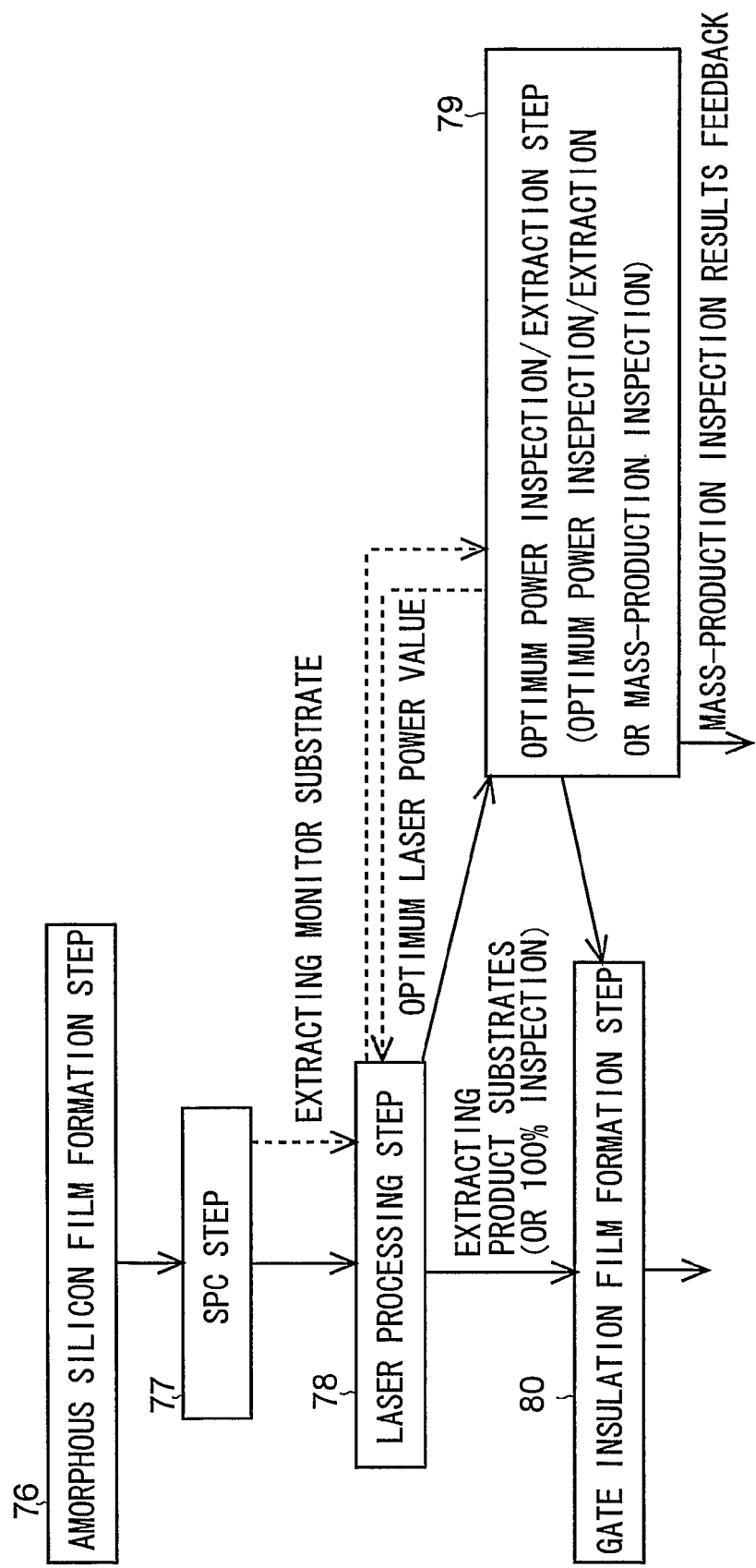
FIG. 20 is a process flow diagram illustrating the process flow according to a preferred embodiment of the present invention when the optimum laser power is automatically determined.

Moreover, for example, as shown in the flow chart in FIG. 20, by using a monitor substrate that has undergone laser processing at different laser powers at different spots in a laser processing step 78, in an optimum power inspection/extraction step 79, the optimum laser power value is automatically evaluated and determined based on results measured by spectroscopy, and the thus determined optimum laser power value is automatically fed to the laser processing equipment 71 used to perform the laser processing step 78. In the laser processing step 78, the laser processing equipment 71 performs, by using the received optimum laser power value, laser processing on product substrates to produce polycrystalline silicon film. Next, in the optimum power inspection/extraction step 79, the product substrate having undergone the laser processing step 78 is inspected for foreign objects and defects in the polycrystalline silicon film. The inspection results are fed back to the laser processing equipment 71.

As compared with Raman spectroscopy, the spectroscopy-based system shown in FIG. 6 and the imaging-based system shown in FIG. 13 permit stable measurement continuously. Even then, it is preferable to calibrate measured values against, for example, a reference sample arranged in the system for the calibration of measured values. In this case, placing the reference sample or the like on the substrate measurement stage eliminates the need for a mechanism for the loading and unloading of an extra reference sample or the like, and also helps reduce the measurement cycle.

A change in the product process or the like may cause a large variation in the characteristic value as the measurement fixed-quality value, making it impossible to obtain a measurement gain or causing other inconveniences. To avoid this, a plurality of references may be prepared so as to provide different norms for different processes and difference models to improve measurement accuracy. Alternatively, a basic reference may be prepared in combination with sub references for different conditions so that the latter are used as substrates for calibration before measurement and the former as an aid for checking time-related variation of lamp brightness and, as when the lamp is burnt out, temporarily as a reference for basic calibration.

Figure 21:
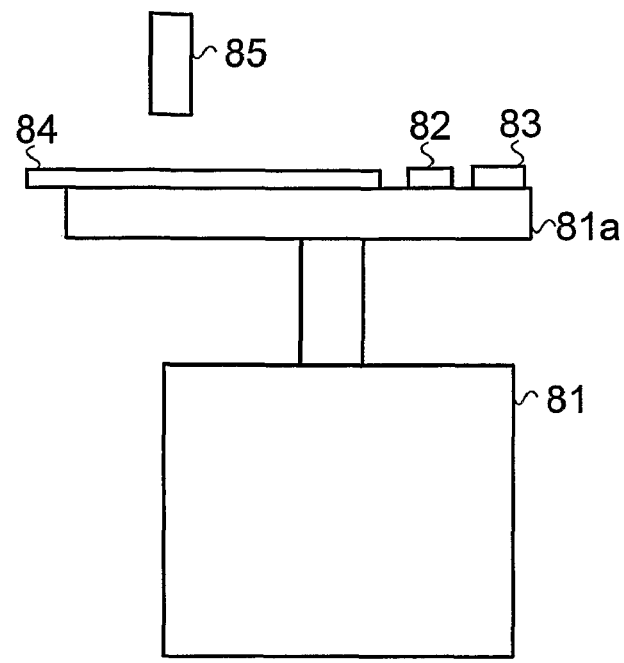
FIG. 21 is a diagram showing how a fixed-quantity substrate is placed on a transport robot.

For example, as shown in FIG. 21, an absolute checking reference substrate 82 formed of an oxidation-resistant material such as a silicon substrate fragment (fragmented for compactness) for checking the absolute amount irrespective of the production process, or a reference substrate 83 for calibrating measured values of production-process-specific product substrate fragments (fragmented for compactness), either for a single process or for a plurality of processes, is placed on a stage 81a for receiving a substrate 84 on a substrate transport robot 81, and calibration is performed with one fragment after another when moved appropriately under a measurement head 85.

With this construction, it is possible to perform calibration (such as the calibration of the illumination brightness) efficiently in spare moments between inspection and substrate transport, and it is no longer necessary to provide mechanisms for transporting reference materials. It is further preferable to place both a calibration substrate for the absolute amount and norm-process-specific calibration substrates. For the absolute value, a material that exhibits little measurement variation such as oxidation under the influence of the environment is selected and used. However, if measurement values are greatly deviated from measurement values obtained with mass-produced products, no measurement gain is obtained (for example, in some cases, mass-produced products or the processing condition process lowers the brightness, and makes it difficult to evaluate crystallization), resulting in lower measurement accuracy. Thus, it is preferable to place process-specific norms together depending on the material of the mass-produced products and the processing process.

In mass-produced substrates, the optimum laser power has a within-the-surface distribution ascribable to the thickness and the thickness distribution of individual substrates. For example, even among a plurality of pieces of laser processing equipment, variations in optical components such as lenses and slight differences in adjustment produce a distribution in the optimum laser power. By performing multiple-point measurement on mass-produced substrates by using the spectroscopic-based system shown in FIG. 6 or the imaging-based system shown in FIG. 13, it is possible to anticipate the trend and the like with different sets of production conditions and with different pieces of laser processing equipment, and thereby to improve product quality and optimize time required for maintenance, for example by reducing the overlooking of, or by detecting in early stages, accidents (local defects) resulting from a lens within the laser processing equipment being chipped or contaminated with a foreign object, to stabilize product quality.

Figure 22:
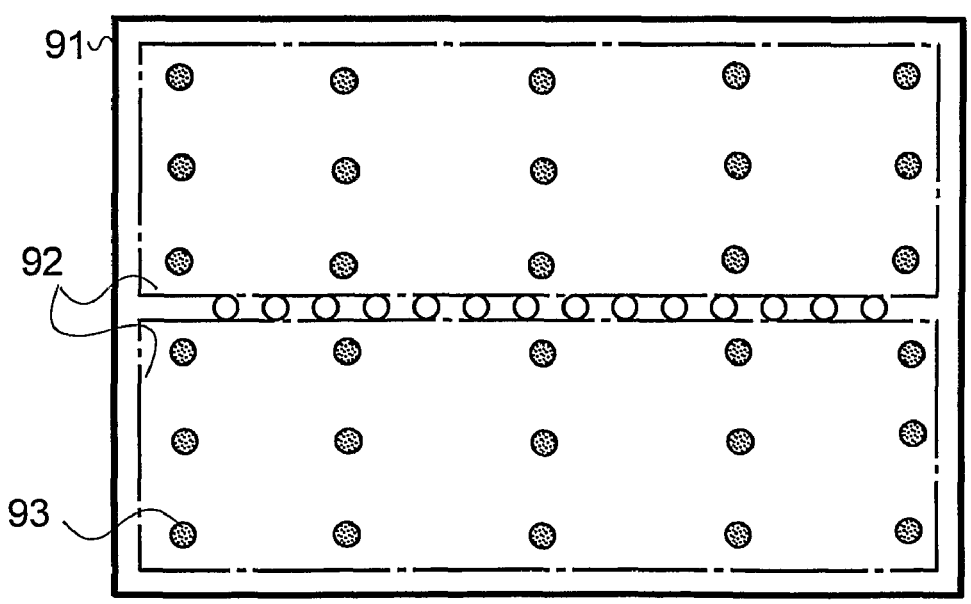
FIG. 22 is a diagram showing the spots where measurement is performed in the functional device portion, which eventually functions as a product, on a product substrate.

For example, multiple-point measurement of the optimum laser power can be achieved, as shown in FIG. 22, by setting a plurality of measurement spots 93 in the functional device portion 92, the portion that will eventually function as a product, on a substrate 91 and then performing measurement by the use of the spectroscopic-based system shown in FIG. 6 or the imaging-based system shown in FIG. 13. It is basically preferable that the measurement spots be located at equal intervals. However, even when the stage is formed of a uniform material and has a uniform color, if there is a slight groove several mm or less deep under the substrate for holding the substrate by suction or otherwise, or a support pin, this causes variations in measured values. Thus, in a case where there is such a groove or the like, measurement spots may be slightly deviated from evenly spaced points. This makes it possible to perform measurement with high accuracy and to anticipate the within-the-surface distribution.

Polycrystalline silicon film can be produced stably by appropriately controlling a number of various factors present in the steps involved, for example the thickness of the film, the quality of the film, the history of the processing temperature, the catalyst scattering rate in the SPC step, etc. The polycrystalline silicon film produced according to the process flow shown in FIG. 2 can be produced in the most controlled and stabilized manner by evaluating two factors, namely the ratio (area ratio) of amorphous silicon film to polycrystalline silicon film before laser processing and the laser power measured on an inspection apparatus employing spectroscopy or imaging, plus the within-the-surface distribution of the laser power measured on the inspection apparatus. For example, in the optimum power inspection/extraction step, the ratio (area ratio) of amorphous silicon film to polycrystalline silicon film before laser processing is inspected, and any substrate that has exceeded a prescribed fixed range in this inspection is prevented from being fed to the succeeding step. In this way, it is possible to keep the characteristics of polycrystalline silicon film within a fixed range. Though varying with variations in the production process and in the laser power, time-related variations in the illumination optical system and in the illumination, and differences among different image processing software programs, when the amount of amorphous before laser processing is about 5% to about 30%, it is possible to obtain a film containing polycrystalline silicon film with satisfactory characteristics.

When the ratio of amorphous silicon film to polycrystalline silicon film before laser processing is inspected, in addition to micro inspection that is performed locally for accurate area ratio measurement and the like, macro inspection for checking film unevenness and the like over the entire substrate may be performed to ensure that production proceeds with the characteristics of the polycrystalline silicon film kept within a fixed range.

Figure 23:
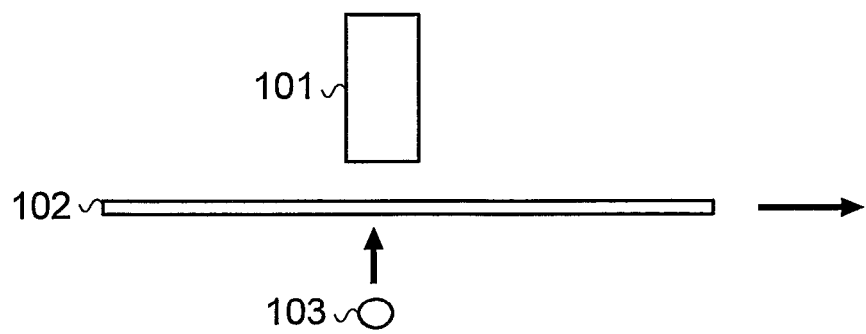
FIG. 23 is a diagram illustrating the macro measurement method.
Figure 24:
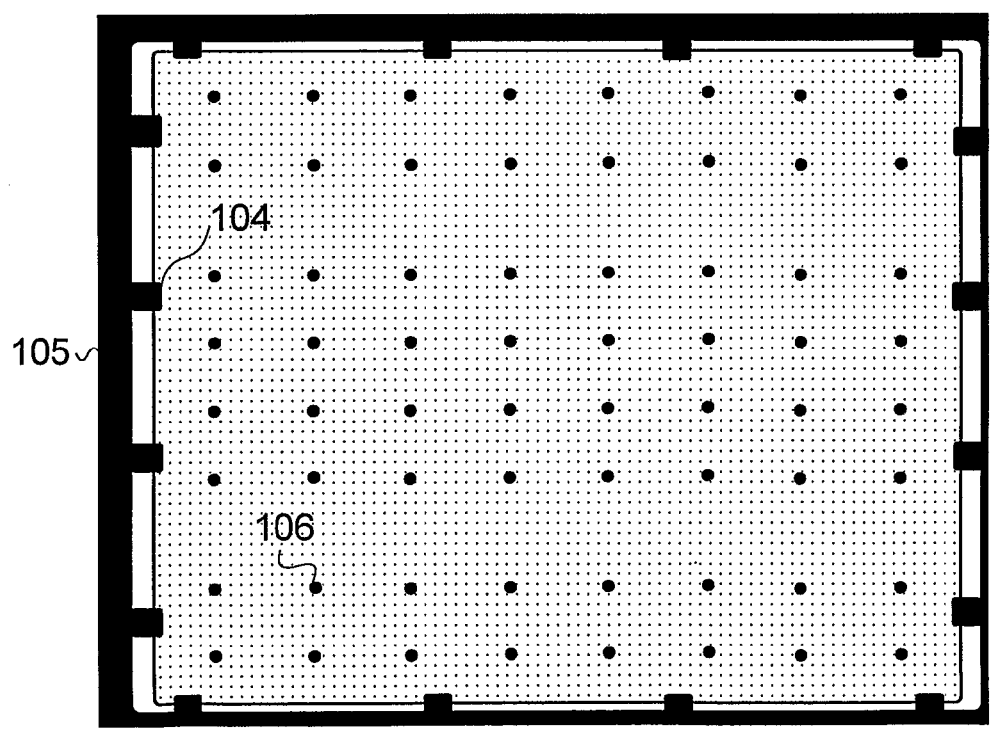
FIG. 24 is a diagram showing a macro photograph taken when a substrate before laser processing is observed at a low magnification.
Figure 25:
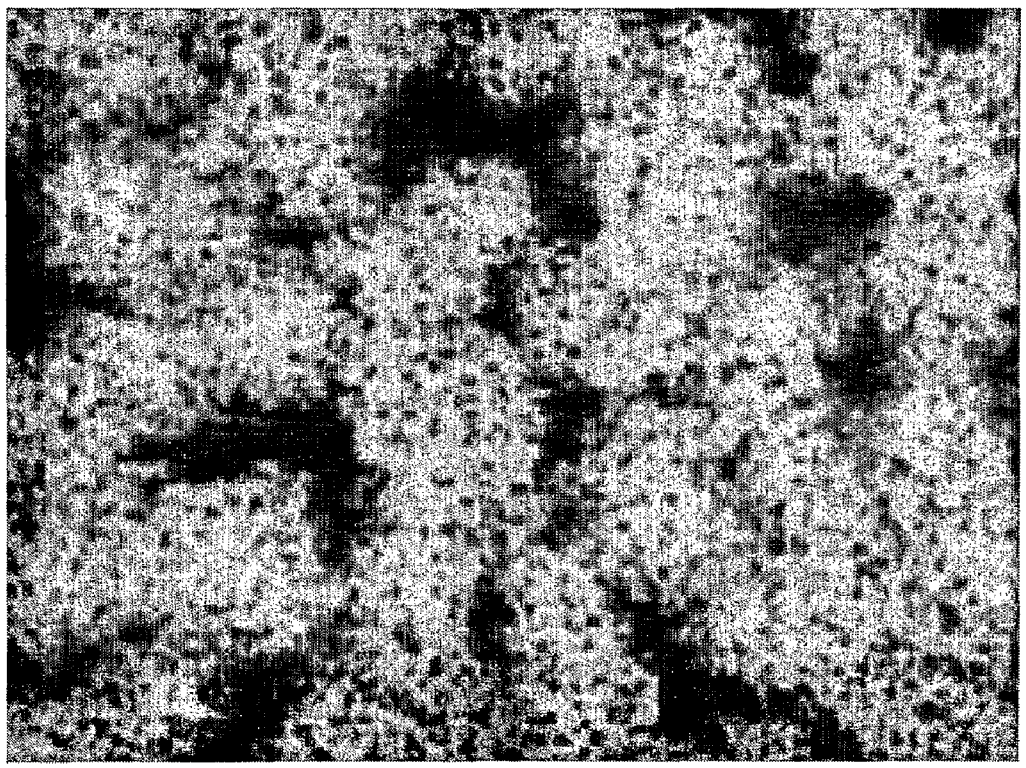
FIG. 25 is a diagram showing a micro photograph taken when a substrate before laser processing is observed at a high magnification.

With reference to FIG. 23, macro inspection and micro inspection will be described below. A substrate 102 is irradiated from the bottom surface thereof with bluish illumination 103 so that amorphous silicon film and polycrystalline silicon film are easily distinguishable. With a camera (line sensor) 101 provided with a magnifying lens, images are taken for inspection while the substrate 102 is moved linearly in a horizontal direction (the direction indicated by an arrow in FIG. 23). FIG. 24 shows a macro photograph obtained at a low magnification, and FIG. 25 shows an example of a micro photograph obtained at a high magnification. In FIG. 24, the black portions are the fixture 104 for holding the substrate in position, the stage frame 105 of the stage on which the substrate is placed, and the substrate support pins 106 (bonded and fixed to an unillustrated glass stage) for stably holding the substrate parallel.

By performing discrimination inspection of amorphous silicon film and polycrystalline silicon film after laser processing in the optimum power inspection/extraction step, it is possible to quickly detect, for example, abnormalities in catalyst scattering (distribution) in the SPC step and abnormalities in the laser optical system. Thus, as compared with detecting abnormalities in characteristics or the like at a stage as late as after the completion of the formation of substrate devices or on the occasion of display inspection after the completion of the fabrication of products such as a liquid crystal display, it is possible to detect and take countermeasures in earlier stages. When the amount of polycrystalline silicon film is about 95% to 100% of the total, it is possible to obtain a film with satisfactory characteristics.

Moreover, by comparing the discrimination inspection data of amorphous silicon film and polycrystalline silicon film before laser processing, it is possible to identify the cause for defects, and thereby to efficiently reduce mass-production losses.

The preferred embodiments of the present invention are extremely useful techniques that permit a method for fabricating a semiconductor device to stably produce high-quality polycrystalline silicon film.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A method for fabricating a semiconductor device, the method including:
forming an amorphous silicon film on a substrate;
preprocessing the amorphous silicon film by modifying the amorphous silicon film to prepare the amorphous silicon film to be made polycrystalline;
laser processing the amorphous silicon film modified through the preprocessing step for producing a polycrystalline silicon film; and
laser power inspecting/extracting
for inspecting for the presence of a foreign object or an abnormality in the preprocessing step by imaging by use of the amorphous silicon film having undergone the preprocessing step, and
for performing laser preprocessing on a predetermined region of the amorphous silicon film having undergone the preprocessing while varying laser power as an irradiated spot moves, and performing inspection using spectroscopy at each of a plurality of positions at which the laser processing has been performed at different laser powers, to determine a laser power based on a result of the inspection; wherein
the laser processing step uses the laser power determined in the laser power inspection/extraction step.

2. The method of claim 1, wherein the spectroscopy is performed at a measurement wavelength of about 700 nm to about 800 nm.

3. The method of claim 1, wherein the inspection using the spectroscopy is performed with measurement light shining on a measurement spot from around the measurement spot.

4. The method of claim 1, wherein the laser power inspection/extraction step includes performing an inspection adjacent laser processing equipment that performs the laser processing in the laser processing step.

5. The method of claim 1, wherein the laser power inspection/extraction step includes setting a measurement fixed-quantity value against which to evaluate measurement results.

6. The method of claim 5, wherein the measurement fixed-quantity value is determined by using equipment having a calibration substrate placed thereon and provided with a function for performing calibration.

7. The method of claim 1, wherein the laser power inspection/extraction step includes automatically determining an optimum laser power value and automatically feeding the automatically determined optimum laser power value to laser processing equipment.

8. The method of claim 1, wherein the laser processing step includes using a laser power about 5 mJ or about 10 mJ lower than an optimum laser power value determined in the laser power inspection/extraction step.

9. The method of claim 1, wherein the laser power inspection/extraction step includes performing multiple-point measurement inspection on the polycrystalline silicon film.

10. The method of claim 1, wherein the laser power inspection/extraction step includes inspecting, before the laser processing, the film on the substrate to find a ratio of amorphous silicon film to polycrystalline silicon film.

11. The method of claim 1, wherein the laser power inspection/extraction step includes inspecting, after the laser processing, the film on the substrate to find a ratio of amorphous silicon film to polycrystalline silicon film.

12. The method of claim 1, wherein the laser power inspection/extraction step includes inspecting, both before and after the laser processing, the film on the substrate to find a ratio of amorphous silicon film to polycrystalline silicon film.

* * * * *